United States Patent
Wang et al.

(10) Patent No.: US 11,085,962 B2
(45) Date of Patent: Aug. 10, 2021

(54) CIRCUIT AGING DETECTION SENSOR BASED ON LOOKUP TABLE

(71) Applicant: Ningbo University, Zhejiang (CN)

(72) Inventors: Pengjun Wang, Zhejiang (CN); Haiming Zhang, Zhejiang (CN); Yuejun Zhang, Zhejiang (CN); Huihong Zhang, Zhejiang (CN)

(73) Assignee: Ningbo University, Zhejiang (CN)

( * ) Notice: Subject to any disclaimer, the term of this patent is extended or adjusted under 35 U.S.C. 154(b) by 160 days.

(21) Appl. No.: 16/676,436

(22) Filed: Nov. 7, 2019

(65) Prior Publication Data
US 2020/0142000 A1 May 7, 2020

(30) Foreign Application Priority Data

Nov. 7, 2018 (CN) .......................... 201811321851.0

(51) Int. Cl.
*G01R 31/00* (2006.01)
*G01R 31/317* (2006.01)
(Continued)

(52) U.S. Cl.
CPC .  *G01R 31/31703* (2013.01); *G01R 31/31725* (2013.01); *H03B 5/1209* (2013.01);
(Continued)

(58) Field of Classification Search
CPC ........ G01R 31/31703; G01R 31/31725; G01R 31/2884; H03B 5/1228; H03B 5/1209;
(Continued)

(56) References Cited

U.S. PATENT DOCUMENTS 9,432,031 B2 *  8/2016 Zhang ..................... H03L 7/097
2008/0270049 A1 * 10/2008 Kim ................. G01R 31/31937
702/58

(Continued)

OTHER PUBLICATIONS

Yao Jianting et al., "Design of a Digital High Precision Aging Sensor Circuit Based on NBTI Effect," Bulletin of Science and Technology, vol. 33, No. 2, Feb. 2017, pp. 1-5.

(Continued)

*Primary Examiner* — Ryan Jager
(74) *Attorney, Agent, or Firm* — JCIPRNET

(57) ABSTRACT

The disclosure discloses a lookup table-based circuit aging detection sensor, including a control circuit, two voltage controlled oscillators (VCOs), two shaping circuits, a phase comparator, a 3-digit voter, a beat-frequency oscillator, an 8-digit counter, a latch, a lookup table array and a digital-analogue converter. The control circuit respectively connects with the phase comparator, the 3-digit voter, the 8-digit counter, the first and the second VCOs. The first and second VCOs connect with the first and second shaping circuits respectively. The first and second shaping circuits connect with the phase comparator. The phase comparator connects with the 3-digit voter. The 3-digit voter connects with the beat-frequency oscillator. The beat-frequency oscillator respectively connects with the 8-digit counter and the latch.

(Continued)

The 8-digit counter connects with the latch. The latch connects with the lookup table array. The lookup table array connects with the digital-analogue converter.

10 Claims, 12 Drawing Sheets

(51) Int. Cl.
    *H03B 5/12* (2006.01)
    *H03K 5/26* (2006.01)
    *H03K 21/02* (2006.01)
    *H03K 5/133* (2014.01)
    *H03K 3/038* (2006.01)
    *H03K 5/01* (2006.01)

(52) U.S. Cl.
    CPC .......... *H03B 5/1228* (2013.01); *H03K 3/038* (2013.01); *H03K 5/01* (2013.01); *H03K 5/133* (2013.01); *H03K 5/26* (2013.01); *H03K 21/026* (2013.01)

(58) Field of Classification Search
    CPC ........ H03K 5/26; H03K 21/026; H03K 5/133; H03K 3/038; H03K 5/01; H03K 3/0322
    USPC .......................................................... 702/58
    See application file for complete search history.

(56) References Cited

U.S. PATENT DOCUMENTS

| | | | | |
|---|---|---|---|---|
| 2013/0285685 | A1* | 10/2013 | Bowman | G06F 1/10 324/750.3 |
| 2015/0301107 | A1* | 10/2015 | Chen | G01R 31/31725 324/762.03 |
| 2016/0377672 | A1* | 12/2016 | Jenkins | G01R 31/2884 324/762.01 |
| 2018/0141566 | A1* | 5/2018 | Kobayashi | B60W 50/0205 |
| 2020/0326373 | A1* | 10/2020 | Dickens | G01R 31/318519 |
| 2020/0408834 | A1* | 12/2020 | Sutaria | G01R 31/2884 |

OTHER PUBLICATIONS

Tae-Hyoung Kim et al., "Silicon Odometer: An On-Chip Reliability Monitor for Measuring Frequency Degradation of Digital Circuits," IEEE Journal of Solid-State Circuits, vol. 43, Issue 4, Apr. 2008, pp. 122-123.

Xiaofei Wang et al., "Silicon Odometers: Compact In Situ Aging Sensors for Robust System Design," IEEE Micro, vol. 34, Issue 6, Nov.-Dec. 2014, pp. 74-85.

* cited by examiner

36 Phase inverters in total

CIRCUIT AGING DETECTION SENSOR BASED ON LOOKUP TABLE

CROSS-REFERENCE TO RELATED APPLICATION

This application claims the priority benefit of China application serial no. 201811321851.0, filed on Nov. 7, 2018. The entirety of the above-mentioned patent application is hereby incorporated by reference herein and made a part of this specification.

TECHNICAL FIELD

The disclosure relates to a circuit aging detection sensor, in particular to a circuit aging detection sensor based on lookup table (LUT).

DESCRIPTION OF THE RELATED ART

As the dimensions of integrated circuits decrease and the integration degree of chips rises gradually, the system performance of chips is improved. However, the reliability of chip circuit structure is lowered in this process. Circuit aging is one of important indexes of circuit reliability. Therefore, anti-aging mechanisms have become a key research subject in the current circuit reliability field.

In the deep-nanometer process stage, negative bias temperature instability (NBTI) has become a key factor which leads to circuit aging. The NBTI effect can cause enhanced channel field strength, threshold voltage drift and saturation current reduction to the PMOS transistors, while changes of such circuit parameters can result in delay of time sequence and decrease in working frequency to cause chip malfunctions. The reliability test of circuit aging degree is the premise of anti-aging treatment. How to maintain excellent performance of circuits within their normal lifespans and how to postpone circuit aging is a key issue of the current nanometer CMOS process that needs to be urgently solved. This issue has become a hotspot of the aging research of integrated circuits.

At present, many domestic research institutes have made deep research on circuit aging, and obtained certain achievements. On the aspect of implementation technology of aging detection sensors, Document 1, *Digital High precision Aging Monitoring Circuit Design Based on NBTI Effect*, disclosed a digital high-precision aging detection circuit through research on the NBTI effect and aging principle. Such technology is low in precision, while the improvement on precision depends on the increase of the circuit area. With the current technology, such solution is not applicable. Document 2, *An On-Chip Reliability Monitor for Measuring Frequency Degradation of Digital Circuits*, which studied ring oscillators and phase comparison circuits, disclosed a full-digital reliability aging detection circuit through quantitative processing of aging signals. However, such circuit still has the problem of low resolution for the circuit aging degree detection, which affects the reliability of the detection circuit.

CONTENTS OF THE PRESENT INVENTION

The technical problem to be solved in the disclosure is to provide a lookup table-based circuit aging detection circuit which has a high detection resolution on the basis of a relatively small area.

To solve the above-mentioned technical problem, the disclosure adopts the following technical solution: A circuit aging detection sensor based on LUT includes a control circuit for generating a clock signal and two paths of control voltage, a first voltage controlled oscillator, a second voltage controlled oscillator, a first shaping circuit, a second shaping circuit, a phase comparator, a 3-digit voter, a beat-frequency oscillator, an 8-digit counter, a latch, a lookup table array and a digital-analogue converter. The control circuit has a clock signal output terminal, a first voltage output terminal and a second voltage output terminal. The phase comparator has a clock terminal, a first input terminal, a second input terminal and an output terminal. The 3-digit voter has a clock terminal, an input terminal and an output terminal. The 8-digit counter has an input terminal, a setting terminal and an 8-digit parallel output terminal. The latch has a setting terminal, an 8-digit parallel input terminal and an 8-digit parallel output terminal. The lookup table array has an 8-digit parallel control terminal, a 16-digit parallel input terminal and an 8-digital parallel output terminal. The digital-analogue converter has an 8-digit parallel input terminal and an output terminal. The clock signal output terminal of the control circuit is respectively connected with the clock terminal of the phase comparator, the clock terminal of the 3-digit voter and the input terminal of the 8-digit counter. The first voltage output terminal of the control circuit is connected with the input terminal of the first voltage controlled oscillator. The second voltage output terminal of the control circuit is connected with the input terminal of the second voltage controlled oscillator. The output terminal of the first voltage controlled oscillator is connected with the input terminal of the first shaping circuit. The output terminal of the second voltage controlled oscillator is connected with the input terminal of the second shaping circuit. The output terminal of the first shaping circuit is connected with the first input terminal of the phase comparator. The output terminal of the second shaping circuit is connected with the second input terminal of the phase comparator. The output terminal of the phase comparator is connected with the input terminal of the 3-digit voter. The output terminal of the 3-digit voter is connected with the input terminal of the beat-frequency oscillator. The output terminal of the beat-frequency oscillator is respectively connected with the setting terminal of the 8-digit counter and the setting terminal of the latch. The 8-digit parallel output terminal of the 8-digit counter is connected with the 8-digit parallel input terminal of the latch. The 8-digit parallel output terminal of the latch is connected with the 8-digit parallel control terminal of the lookup table array. The 8-digit parallel output terminal of the lookup table array is connected with the 8-digit parallel input terminal of the digital-analogue converter.

The first voltage controlled oscillator includes 33 voltage controlled oscillator (VCO) units. Each one of the VCO units has a first input terminal, a second input terminal, a first output terminal, a second output terminal, a power terminal and a grounding terminal. The power terminals of all 33 VCO units are connected to a power supply, and the grounding terminals of all 33 VCO units are grounded. The first input terminal of the first VCO unit is connected with the first output terminal of the 33rd VCO unit, and the connecting terminal is the output terminal of the first voltage controlled oscillator; the second input terminal of the first VCO unit is connected with the second output terminal of the 33rd VCO unit; the first output terminal of the kth VCO unit is connected with the first input terminal of the (K+1)th VCO unit; the second output terminal of the kth VCO unit is connected with the second input terminal of the (K+1)th VCO unit, k+1, 2, . . . , 32. Each one of the VCO units includes a first PMOS tube, a second PMOS tube, a first NMOS tube and a second NMOS tube, wherein the source electrode of the first PMOS tube is connected with the source electrode of the second PMOS tube, and the connecting terminal is the power terminal of the VCO unit; the grid electrode of the first PMOS tube and the drain electrode of the second PMOS tube are connected with the drain electrode of the second NMOS tube, and the connecting terminal is the first output terminal of the VCO unit; the drain electrode of the first PMOS tube and the grid electrode of the second PMOS tube are connected with the drain electrode of the first NMOS tube, and the connecting terminal is the second output terminal of the VCO unit; the grid electrode of the first NMOS tube is the first input terminal of the VCO unit; the grid electrode of the second NMOS tube is the second input terminal of the VCO unit; the source electrode of the first NMOS tube is connected with the source electrode of the second NMOS tube, and the connecting terminal is the grounding terminal of the VCO unit. The circuit structure of the second voltage controlled oscillator is identical with the circuit structure of the first voltage controlled oscillator. In the circuit, the first and second voltage controlled oscillators respectively consist of 33 VCO units. By using the delay feature of the VCO units, the second input terminal of the first VCO unit of each voltage controlled oscillator is connected with the second output terminal of the 33rd VCO unit of the voltage controlled oscillator to generate a periodical square wave signal by the effect of a direct-current power supply. The structure is simple and easily obtained.

The first shaping circuit includes a third PMOS tube, a fourth PMOS tube, a third NMOS tube, a fourth NMOS tube and a first phase inverter. The source electrode of the third PMOS tube and the source electrode of the fourth PMOS tube are both connected to the power supply. The grid electrode of the third PMOS tube and the drain electrode of the fourth PMOS tube are connected with the drain electrode of the fourth NMOS tube, and the connecting terminal is the output terminal of the first shaping circuit. The drain electrode of the third PMOS tube and the grid electrode of the fourth PMOS tube are connected with the drain electrode of the third NMOS tube. The grid electrode of the third NMOS tube is connected with the input terminal of the first phase inverter, and the connecting terminal is the input terminal of the first shaping circuit. The output terminal of the first phase inverter is connected with the grid electrode of the fourth NMOS tube. The source electrode of the third NMOS tube and the source electrode of the fourth NMOS tube are both grounded. The circuit structure of the second shaping circuit is identical with the circuit structure of the first shaping circuit. In the circuit, when the first shaping circuit is input with a low level, a signal passes through the first phase inverter to switch on the fourth NMOS tube, and the output is lowered by the fourth NMOS tube; when the input is a high level, the third NMOS tube is switched on, so that the grid voltage of the fourth PMOS tube is zero and the fourth PMOS tube is switched on to output a high level. Thus, the output signals of the first shaping circuit and the second shaping circuit are switched between two status, namely high level and low level, thereby effectively eliminating spikes in the output signals of the first and second voltage controlled oscillators.

The phase comparator includes a fifth PMOS tube, a sixth PMOS tube, a fifth NMOS tube, a sixth NMOS tube, a seventh NMOS tube, a second phase inverter, a third phase inverter, a fourth phase inverter and a first two-input AND gate. The first two-input AND gate has a first input terminal, a second input terminal and an output terminal. The source electrode of the fifth PMOS tube and the source electrode of the sixth PMOS tube are both connected to the power supply. The grid electrode of the fifth PMOS tube is connected with the grid electrode of the seventh NMOS tube, and the connecting terminal is the clock terminal of the phase comparator. The drain electrode of the fifth PMOS tube, the drain electrode of the sixth NMOS tube and the grid electrode of the sixth PMOS tube are connected with the input terminal of the second phase inverter. The drain electrode of the sixth PMOS tube, the output terminal of the second phase inverter and the drain electrode of the fifth NMOS tube are connected with the input terminal of the third phase inverter. The grid electrode of the sixth NMOS tube is connected with the output terminal of the first two-input AND gate. The source electrode of the sixth NMOS tube is connected with the drain electrode of the seventh NMOS tube. The source electrode of the seventh NMOS tube and the source electrode of the fifth NMOS tube are both grounded. The grid electrode of the fifth NMOS tube and the output terminal of the third phase inverter are connected with the input terminal of the fourth phase inverter. The output terminal of the fourth phase inverter is the output terminal of the phase comparator. The first input terminal of the first two-input AND gate is the first input terminal of the phase comparator. The second input terminal of the first two-input AND gate is the second input terminal of the phase comparator. In the circuit, the phase comparator uses the first two-input AND gate and the sixth NMOS tube as a drop-down network; when the drop-down network outputs the logic "1", the drain electrode of the fifth PMOS tube is equivalently directly connected to the drain electrode of the seventh NMOS tube to ensure quick discharge at the drain electrode of the fifth PMOS tube, thereby further effectively eliminating the spikes in the output signals of the first and second voltage controlled oscillators and enhancing detection resolution.

The 3-digit voter includes a second two-input AND gate, a third two-input AND gate, a fourth two-input AND gate, a first two-input NOT-AND gate, a second two-input NOT-AND gate, a first D trigger and a second D trigger. The second two-input AND gate, the third two-input AND gate, the fourth two-input AND gate, the first two-input NOT-AND gate and the second two-input NOT-AND gate respectively have a first input terminal, a second input terminal and an output terminal. The first D trigger and the second D trigger respectively have an input terminal, an output terminal, a phase inversion output terminal and a clock terminal. The first input terminal of the second two-input AND gate is connected with the first input terminal of the third two-input AND gate, and the connecting terminal is the input terminal of the 3-digit voter. The second input terminal of the second two-input AND gate is connected with the output terminal of the first two-input NOT-AND gate. The output terminal of the second two-input AND gate is connected with the input terminal of the first D trigger. The second input terminal of the third two-input AND gate is connected with the output terminal of the second two-input NOT-AND gate. The output terminal of the third two-input NAD gate is connected with the input terminal of the second D trigger. The first input terminal of the first two-input NOT-AND gate and the output terminal of the first D trigger are connected with the first input terminal of the fourth two-input AND gate. The second input terminal of the first two-input NOT-AND gate and the second input terminal of the second two-input NOT-AND gate are connected with the phase inversion output terminal of the second D trigger. The first input terminal of the second two-input NOT-AND gate is connected with the phase inversion output terminal of the first D trigger. The output terminal of the second D trigger is connected with the second input terminal of the fourth two-input AND gate. The output terminal of the fourth two-input AND gate is the output terminal of the 3-digit voter. The clock terminal of the first D trigger is connected with the clock terminal of the second D trigger, and the connecting terminal is the clock terminal of the 3-digit voter. In the circuit, the 3-digit voter continuously acquires three high levels and then outputs a high level via the fourth two-input AND gate, thereby eliminating spikes in the previous circuit acquisition, avoiding supply voltage noises or other uncertain noises from interfering with aging signal acquisition, and improving the counter accuracy of acquiring the measured value.

The 8-digit counter includes a fifth phase inverter, a sixth phase inverter, a seventh phase inverter, an eighth phase inverter, a ninth phase inverter, a tenth phase inverter, a 11th phase inverter, a 12th phase inverter, a third D trigger, a fourth D trigger, a fifth D trigger, a sixth D trigger, a seventh trigger, an eighth trigger, a ninth trigger and a tenth trigger. The third D trigger, the fourth D trigger, the fifth D trigger, the sixth D trigger, the seventh D trigger, the eighth D trigger, the ninth D trigger and the tenth D trigger respectively have a clock terminal, an input terminal, an output terminal and a setting terminal. The clock terminal of the third D trigger is the clock terminal of the 8-digit counter. The setting terminals of the third D trigger, the fourth D trigger, the fifth D trigger, the sixth D trigger, the seventh D trigger, the eighth D trigger, the ninth D trigger and the 10th D trigger are connected, and the connecting terminal is the setting terminal of the 8-digit counter. The clock terminal of the third D trigger is the input terminal of the 8-digit counter; the input terminal of the third D trigger is connected with the output terminal of the fifth phase inverter; the output terminal of the third D trigger and the input terminal of the fifth phase inverter are connected with the clock terminal of the fourth D trigger, and the connecting terminal is the first digit of the 8-digit parallel output terminal of the 8-digit counter. The input terminal of the fourth D trigger is connected with the output terminal of the sixth phase inverter; the output terminal of the fourth D trigger and the input terminal of the sixth phase inverter are connected with the clock terminal of the fifth D trigger, and the connecting terminal is the second digit of the 8-digit parallel output terminal of the 8-digit counter. The input terminal the fifth D trigger is connected with the output terminal of the seventh phase inverter; the output terminal of the fifth D trigger and the input terminal of the seventh phase inverter are connected with the clock terminal of the sixth D trigger, and the connecting terminal of the third digit of the 8-digit parallel output terminal of the 8-digit counter. The input terminal of the sixth D trigger is connected with the output terminal of the eighth phase inverter; the output terminal of the sixth D trigger and the input terminal of the eighth phase inverter are connected with the clock terminal of the seventh D trigger, and the connecting terminal is the fourth digit of the 8-digit parallel output terminal of the 8-digit counter. The input terminal of the seventh D trigger is connected with the output terminal of the ninth phase inverter; the output terminal of the seventh D trigger and the input terminal of the ninth phase inverter are connected with the clock terminal of the eighth D trigger, and the connecting terminal is the fifth digit of the 8-digit parallel output terminal of the 8-digit counter. The input terminal of the eighth D trigger is connected with the output terminal of the tenth phase inverter; the output terminal of the eighth D trigger and the input terminal of the tenth phase inverter are connected with the clock terminal of the ninth D trigger, and the connecting terminal is the sixth digit of the 8-digit parallel output terminal of the 8-digit counter. The input terminal of the ninth D trigger is connected with the output terminal of the 11th phase inverter; the output terminal of the ninth D trigger and the input terminal of the 11 th phase inverter are connected with the clock terminal of the tenth D trigger, and the connecting terminal is the seventh digit of the 8-digit parallel output terminal of the 8-digit counter. The input terminal of the tenth D trigger is connected with the output terminal of the 12th phase inverter; the input terminal of the 12th phase inverter is connected with the output terminal of the tenth D trigger, and the connecting terminal is the eighth digit of the 8-digit parallel output terminal of the 8-digit counter. In the circuit, the D triggers 3-10 are edge D triggers with a resetting signal, capable of effectively zeroing the 8-digit counter. The 8-digit counter counts in an asynchronous mode, capable of effectively reducing the turnover frequency of the D triggers and lowering the power consumption of the circuit.

The beat-frequency oscillator includes a delay chain, a 13th phase inverter, a 14th phase inverter, a 15th phase inverter and a first two-input NOT gate. The first two-input NOT gate has a first input terminal, a second input terminal and an output terminal. An input terminal of the delay chain is connected with the first input terminal of the first two-input NOT gate, and the connecting terminal is the input terminal of the beat-frequency oscillator. An output terminal of the delay chain is connected with the second input terminal of the first two-input NOT gate. The output terminal of the first two-input NOT gate is connected with the input terminal of the 13th phase inverter. The output terminal of the 13th phase inverter is connected with the input terminal of the 14th phase inverter. The input terminal of the 14th phase inverter is connected with the input terminal of the 15th phase inverter. The output terminal of the 15th phase inverter is the output terminal of the beat-frequency oscillator. The delay chain is formed by 36 phase inverters in series connection, wherein an input terminal of the first phase inverter is the input terminal of the delay chain, and an output terminal of the 36th phase inverter is the output terminal of the delay chain. In the circuit, the delay signal generated by the beat-frequency oscillator via the delay chain and the input terminal signal of the delay chain execute the NOT logic to generate an edge detection signal with a certain pulse width. The beat-frequency oscillator provides a resetting zeroing signal for the 8-digit counter. The circuit structure is simple.

The latch includes 8 latch units identical with structure. Each one of the latch units has an input terminal, an output terminal and a setting terminal. The resetting units of the 8 latch units are connected, and the connecting terminal is the setting terminal of the latch. The input terminal of the first latch unit is the first digit of the 8-digit parallel input terminal of the latch; the output terminal of the first latch unit is the first digit of the 8-digit parallel output terminal of the latch; the input terminal of the second latch unit is the second digit of the 8-digit parallel input terminal of the latch; the output terminal of the second latch unit is the second digit of the 8-digit parallel output terminal of the latch; the input terminal of the third latch unit is the third digit of the 8-digit parallel input terminal of the latch; the output terminal of the third latch unit is the third digit of the 8-digit parallel output terminal of the latch; the input terminal of the fourth latch unit is the fourth digit of the 8-digit parallel input terminal of the latch; the output terminal of the fourth latch unit is the fourth digit of the 8-digit parallel output terminal of the latch; the input terminal of the fifth latch unit is the fifth digit of the 8-digit parallel input terminal of the latch; the output terminal of the fifth latch unit is the fifth digit of the 8-digit parallel output terminal of the latch; the input terminal of the sixth latch unit is the sixth digit of the 8-digit parallel input terminal of the latch; the output terminal of the sixth latch unit is the sixth digit of the 8-digit parallel output terminal of the latch; the input terminal of the seventh latch unit is the seventh digit of the 8-digit parallel input terminal of the latch; the output terminal of the seventh latch unit is the seventh digit of the 8-digit parallel output terminal of the latch; the input terminal of the eighth latch unit is the eighth digit of the 8-digit parallel input terminal of the latch; and the output terminal of the eighth latch unit is the eighth digit of the 8-digit parallel output terminal of the latch. Each one of the latch units includes a fifth two-input AND gate, a sixth two-input AND gate, the 16th phase inverter, a second two-input NOT gate and a third two-input NOT gate; wherein in each one of the latch units, the fifth two-input AND gate, the sixth two-input AND gate, the second two-input NOT gate and the third two-input NOT gate respectively have a first input terminal, a second input terminal and an output terminal, the first input terminal of the fifth two-input AND gate is connected with the output terminal of the 16th phase inverter, the second input terminal of the fifth two-input AND gate is connected with the first input terminal of the sixth two-input AND gate and the connecting terminal is the setting terminal of the latch unit, the second input terminal of the second two-input NOT gate is connected with the output terminal of the third two-input NOT gate, the output terminal of the second two-input NOT gate is connected with the first input terminal of the third two-input NOT gate and the connecting terminal is the output terminal of the latch unit, and the second input terminal of the third two-input NOT gate is connected with the output terminal of the sixth two-input AND gate. In the circuit, the latch respectively latches the output data of the previous circuit via the latch units; when the latched signal is effective, the input signal is steadily stored, and output until the next latch signal comes. The structure solves the synchronization problem of signals and improves the driving capacity of the circuit at the same time.

The control circuit includes a first direct-current power supply for generating the first control voltage, a second direct-current power supply for generating the second control voltage and a pulse power supply for generating a clock signal. The control circuit can provide the whole system with an excitation power supply to guarantee that the whole system functions well.

Compared with the prior art, the advantages of the disclosure are as follows: The control circuit for generating the clock signal and the two-path control voltages, the first voltage controlled oscillator, the second voltage controlled oscillator, the first shaping circuit, the second shaping circuit, the phase comparator, the 3-digit voter, the beat-frequency oscillator, the 8-digit counter, the latch, the lookup table array and the digital-analogue converter constitute a sensor; the second voltage output terminal of the control circuit is connected with the input terminal of the second voltage controlled oscillator; the output terminal of the first voltage controlled oscillator is connected with the input terminal of the first shaping circuit; the output terminal of the second voltage controlled oscillator is connected with the input terminal of the second shaping circuit; the output terminal of the first shaping circuit is connected with the first input terminal of the phase comparator; the output terminal of the second shaping circuit is connected with the second input terminal of the phase comparator; the output terminal of the phase comparator is connected with the input terminal of the 3-digit voter; the output terminal of the 3-digit voter is connected with the input terminal of the beat-frequency oscillator; the output terminal of the beat-frequency oscillator is respectively connected with the setting terminal of the 8-digit counter and the setting terminal of the latch; the 8-digit parallel output terminal of the 8-digit counter is connected with the 8-digit parallel input terminal of the latch; the 8-digit parallel output terminal of the latch is connected with the 8-digit parallel control terminal of the lookup table array; and the 8-digit parallel output terminal of the lookup table array is connected with the 8-digit parallel input terminal of the digital analogue converter. During an aging test, the first voltage output terminal of the control circuit outputs a direct-current voltage to control the first voltage controlled oscillator circuit to generate a reference frequency signal; the second voltage output terminal of the control circuit outputs a direct-current voltage to control the second voltage controlled oscillator to generate an aging frequency signal; the first shaping circuit processes spike signals in the reference frequency signal; the second shaping circuit processes the spike signals in the aging frequency signals; then the phase comparator further removes the spike signals to ensure the accuracy of the aging detection signal. In this way, on the premise of overall achieving the sensor functions, the disclosure improves the aging detection resolution. Through the TSMC 65 nm CMOS process, the sensor of the disclosure, which performs simulation analyses with Virtuoso tools, can achieve a resolution up to 0.0018% in a small chip area, greatly improving the capability of sensing circuit aging. The disclosure can be widely applied to aging test of high-precision equipment.

DESCRIPTION OF SEVERAL VIEWS OF THE ATTACHED DRAWINGS

DESCRIPTION OF PREFERRED EMBODIMENTS

The disclosure is further detailed in detail in conjunction with the attached drawings.

Embodiment 1

Figure 1:
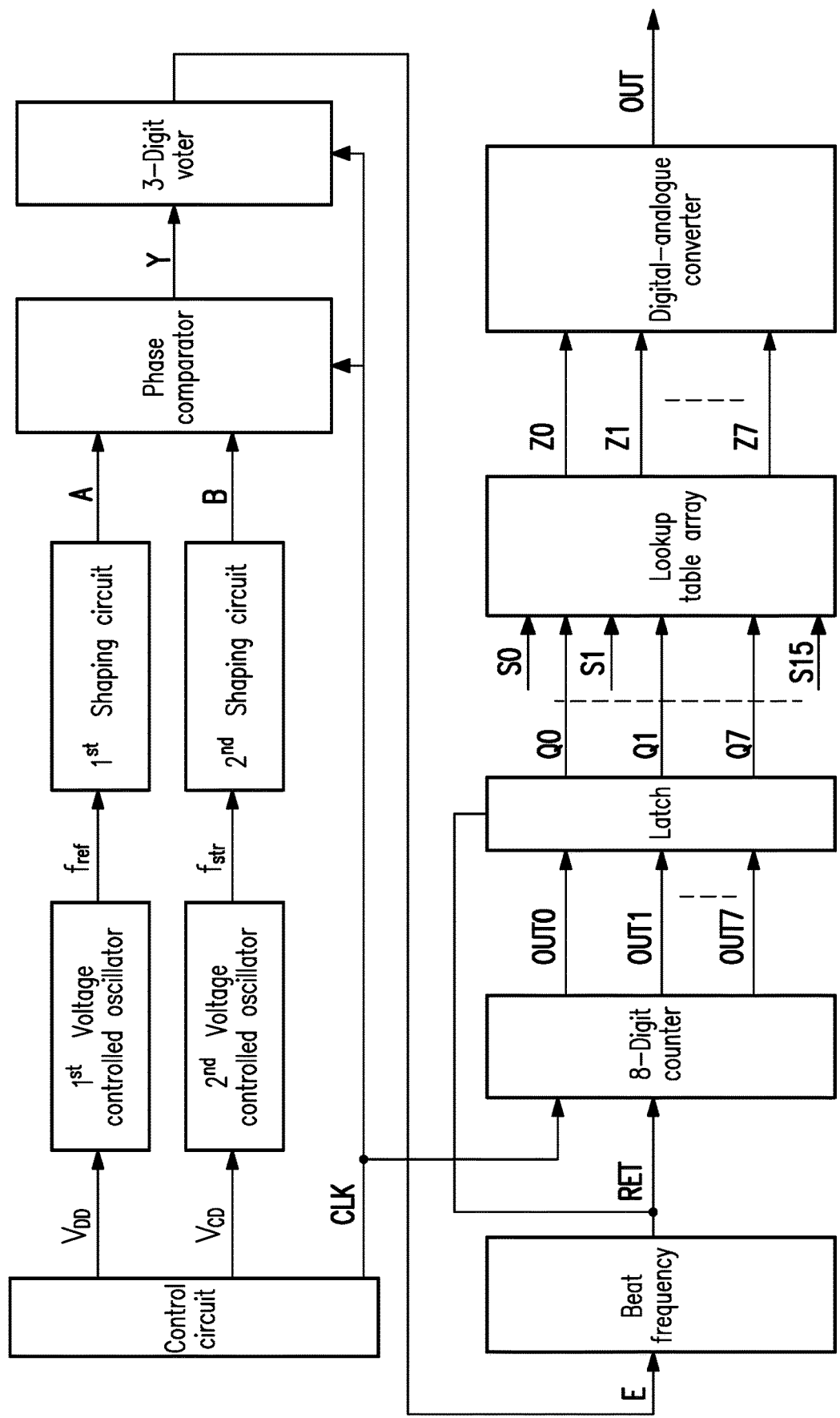
FIG. 1 is a structural block diagram of the disclosure.

As shown in FIG. 1, a circuit aging detection sensor based on LUT includes a control circuit for generating a clock signal and two paths of control voltage, a first voltage controlled oscillator, a second voltage controlled oscillator, a first shaping circuit, a second shaping circuit, a phase comparator, a 3-digit voter, a beat-frequency oscillator, an 8-digit counter, a latch, a lookup table array and a digital-analogue converter. The control circuit has a clock signal output terminal, a first voltage output terminal and a second voltage output terminal. The phase comparator has a clock terminal, a first input terminal, a second input terminal and an output terminal. The 3-digit voter has a clock terminal, an input terminal and an output terminal. The 8-digit counter has an input terminal, a setting terminal and an 8-digit parallel output terminal. The latch has a setting terminal, an 8-digit parallel input terminal and an 8-digit parallel output terminal. The lookup table array has an 8-digit parallel control terminal, a 16-digit parallel input terminal and an 8-digital parallel output terminal. The digital-analogue converter has an 8-digital parallel input terminal and an output terminal. The clock signal output terminal of the control circuit is respectively connected with the clock terminal of the phase comparator, the clock terminal of the 3-digit voter and the input terminal of the 8-digit counter. The first voltage output terminal of the control circuit is connected with the input terminal of the first voltage controlled oscillator. The second voltage output terminal of the control circuit is connected with the input terminal of the second voltage controlled oscillator. The output terminal of the first voltage controlled oscillator is connected with the input terminal of the first shaping circuit. The output terminal of the second voltage controlled oscillator is connected with the input terminal of the second shaping circuit. The output terminal of the first shaping circuit is connected with the first input terminal of the phase comparator. The output terminal of the second shaping circuit is connected with the second input terminal of the phase comparator. The output terminal of the phase comparator is connected with the input terminal of the 3-digit voter. The output terminal of the 3-digit voter is connected with the input terminal of the beat-frequency oscillator. The output terminal of the beat-frequency oscillator is respectively connected with the setting terminal of the 8-digit counter and the setting terminal of the latch. The 8-digit parallel output terminal of the 8-digit counter is connected with the 8-digit parallel input terminal of the latch. The 8-digit parallel output terminal of the latch is connected with the 8-digit parallel control terminal of the lookup table array. The 8-digit parallel output terminal of the lookup table array is connected with the 8-digit parallel input terminal of the digital-analogue converter. The first voltage output terminal of the control circuit is connected with the input terminal of the first voltage controlled oscillator. The second voltage output terminal of the control circuit is connected with the input terminal of the second voltage controlled oscillator. The control signal output terminal of the control circuit outputs a clock signal CLK. The output terminal of the digital-analogue converter is the output terminal of the terminal, used for outputting an aging detection signal OUT. The 8-digit parallel output terminal of the latch outputs an 8-digit parallel signal Q0Q1Q2Q3Q4Q5Q6Q7.

Figure 2:
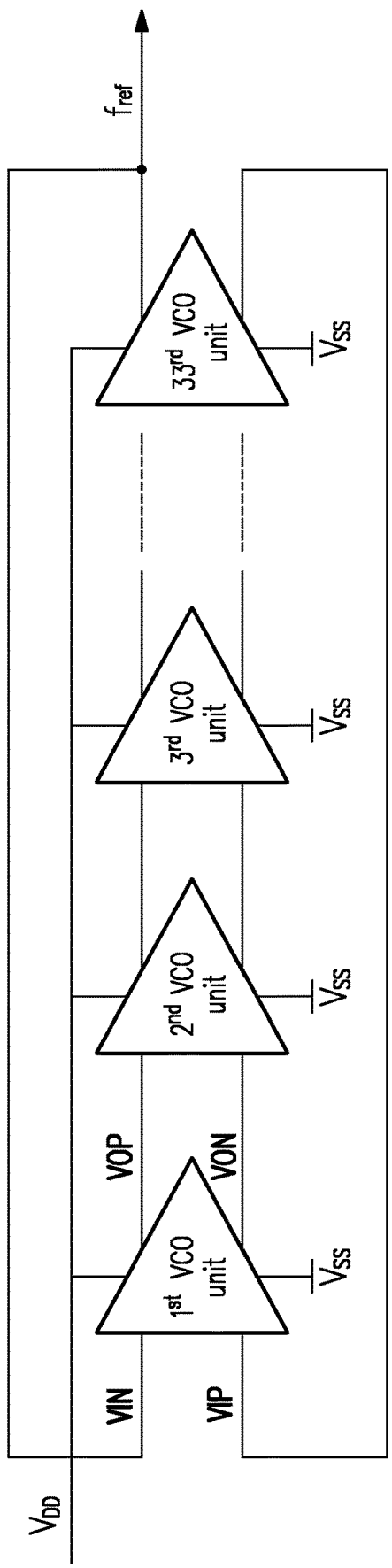
FIG. 2 is a circuit diagram of the first voltage controlled oscillator of the disclosure.
Figure 3:
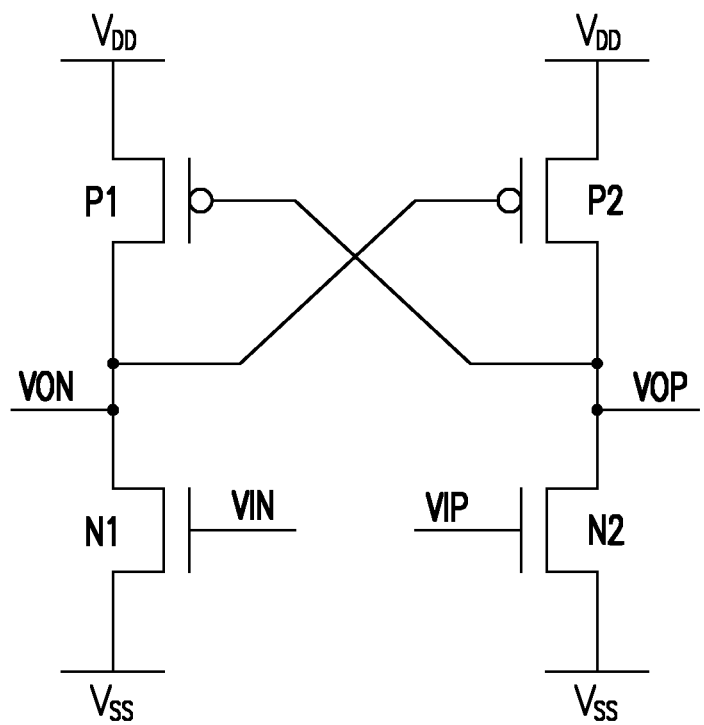
FIG. 3 is a circuit diagram of the VCO unit of the disclosure.

As shown in FIG. 2 and FIG. 3, in this embodiment, the first voltage controlled oscillator includes 33 VCO units. Each one of the VCO units has a first input terminal, a second input terminal, a first output terminal, a second output terminal, a power terminal and a grounding terminal. The power terminals of all 33 voltage controlled oscillator (VCO) units are connected to a power supply, and the grounding terminals of all 33 VCO units are grounded. The first input terminal of the first VCO unit is connected with the first output terminal of the 33rd VCO unit, and the connecting terminal is the output terminal of the first voltage controlled oscillator; the second input terminal of the first VCO unit is connected with the second output terminal of the 33rd VCO unit; the first output terminal of the kth VCO unit is connected with the first input terminal of the (K+1)th VCO unit; the second output terminal of the kth VCO unit is connected with the second input terminal of the (K+1)th VCO unit, k+1, 2, . . . , 32. Each one of the VCO units includes a first PMOS tube P1, a second PMOS tube P2, a first NMOS tube N1 and a second NMOS tube N2, wherein the source electrode of the first PMOS tube P1 is connected with the source electrode of the second PMOS tube P2, and the connecting terminal is the power terminal of the VCO unit; the grid electrode of the first PMOS tube P1 and the drain electrode of the second PMOS tube P2 are connected with the drain electrode of the second NMOS tube N2, and the connecting terminal is the first output terminal of the VCO unit; the drain electrode of the first PMOS tube P1 and the grid electrode of the second PMOS tube P2 are connected with the drain electrode of the first NMOS tube N1, and the connecting terminal is the second output terminal of the VCO unit; the grid electrode of the first NMOS tube N1 is the first input terminal of the VCO unit; the grid electrode of the second NMOS tube N2 is the second input terminal of the VCO unit; the source electrode of the first NMOS tube N1 is connected with the source electrode of the second NMOS tube N2, and the connecting terminal is the grounding terminal of the VCO unit. The circuit structure of the second voltage controlled oscillator is identical with the circuit structure of the first voltage controlled oscillator.

Figure 4:
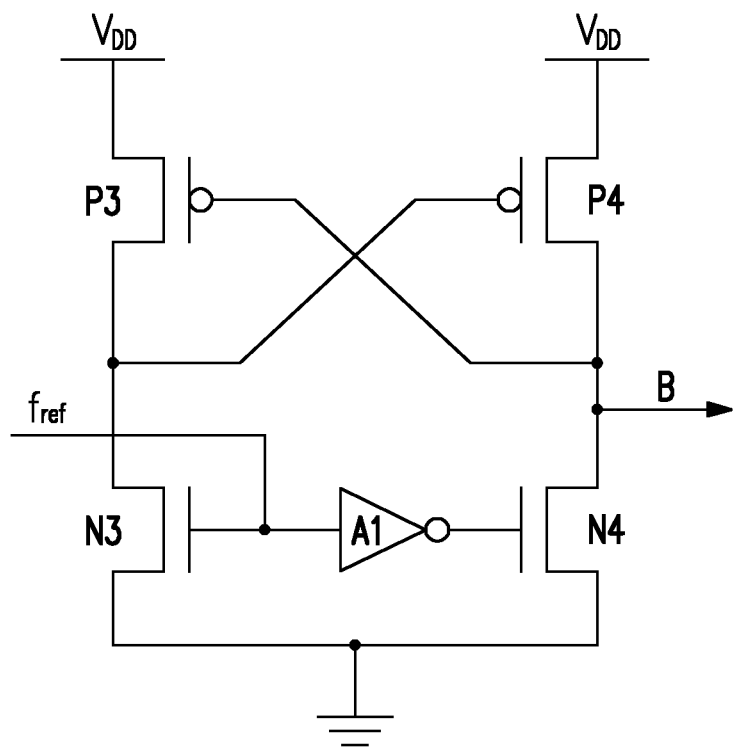
FIG. 4 is a circuit diagram of the first shaping circuit of the disclosure.

As shown in FIG. 4, in this embodiment, the first shaping circuit includes a third PMOS tube P3, a fourth PMOS tube P4, a third NMOS tube N3, a fourth NMOS tube N4 and a first phase inverter A1. The source electrode of the third PMOS tube P3 and the source electrode of the fourth PMOS tube P4 are both connected to the power supply. The grid electrode of the third PMOS tube P3 and the drain electrode of the fourth PMOS tube P4 are connected with the drain electrode of the fourth NMOS tube N4, and the connecting terminal is the output terminal of the first shaping circuit. The drain electrode of the third PMOS tube P3 and the grid electrode of the fourth PMOS tube P4 are connected with the drain electrode of the third NMOS tube N3. The grid electrode of the third NMOS tube N3 is connected with the input terminal of the first phase inverter A1, and the connecting terminal is the input terminal of the first shaping circuit. The output terminal of the first phase inverter A1 is connected with the grid electrode of the fourth NMOS tube N4. The source electrode of the third NMOS tube N3 and the source electrode of the fourth NMOS tube N4 are both grounded. The circuit structure of the second shaping circuit is identical with the circuit structure of the first shaping circuit.

Figure 5:
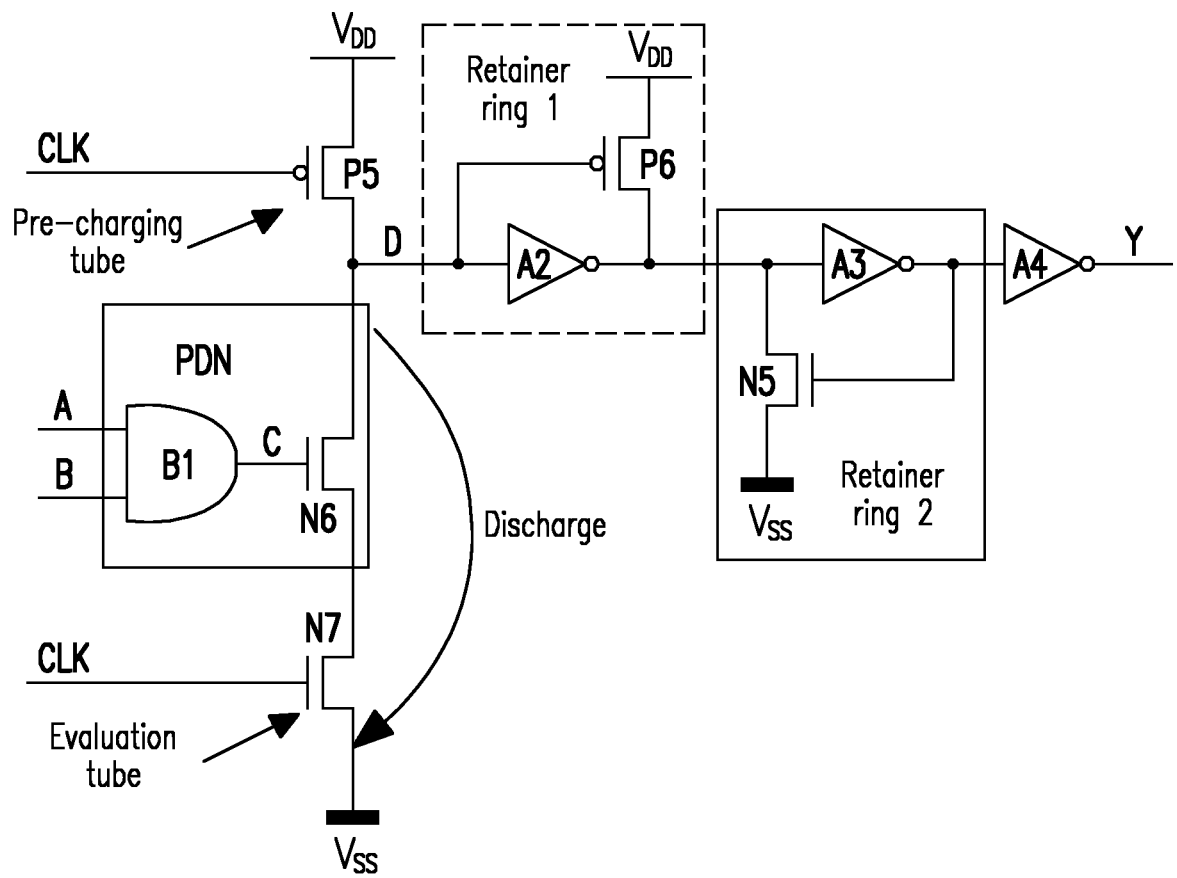
FIG. 5 is a circuit diagram of the phase inverter of the disclosure.

As shown in FIG. 5, in this embodiment, the phase comparator includes a fifth PMOS tube P5, a sixth PMOS tube P6, a fifth NMOS tube N5, a sixth NMOS tube N6, a seventh NMOS tube N7, a second phase inverter A2, a third phase inverter A3, a fourth phase inverter A4 and a first two-input AND gate B1. The first two-input AND gate B1 has a first input terminal, a second input terminal and an output terminal. The source electrode of the fifth PMOS tube P5 and the source electrode of the sixth PMOS P6 tube are both connected to the power supply. The grid electrode of the fifth PMOS tube P5 is connected with the grid electrode of the seventh NMOS tube P6, and the connecting terminal is the clock terminal of the phase comparator. The drain electrode of the fifth PMOS tube P5, the drain electrode of the sixth NMOS tube N6 and the grid electrode of the sixth PMOS tube P6 are connected with the input terminal of the second phase inverter A2. The drain electrode of the sixth PMOS tube P6, the output terminal of the second phase inverter A2 and the drain electrode of the fifth NMOS tube P5 are connected with the input terminal of the third phase inverter A3. The grid electrode of the sixth NMOS tube N6 is connected with the output terminal of the first two-input AND gate B1. The source electrode of the sixth NMOS tube N6 is connected with the drain electrode of the seventh NMOS tube N7. The source electrode of the seventh NMOS tube N7 and the source electrode of the fifth NMOS tube N5 are both grounded. The grid electrode of the fifth NMOS tube N5 and the output terminal of the third phase inverter A3 are connected with the input terminal of the fourth phase inverter A4. The output terminal of the fourth phase inverter A4 is the output terminal of the phase comparator. The first input terminal of the first two-input AND gate B1 is the first input terminal of the phase comparator. The second input terminal of the first two-input AND gate B1 is the second input terminal of the phase comparator.

Figure 6:
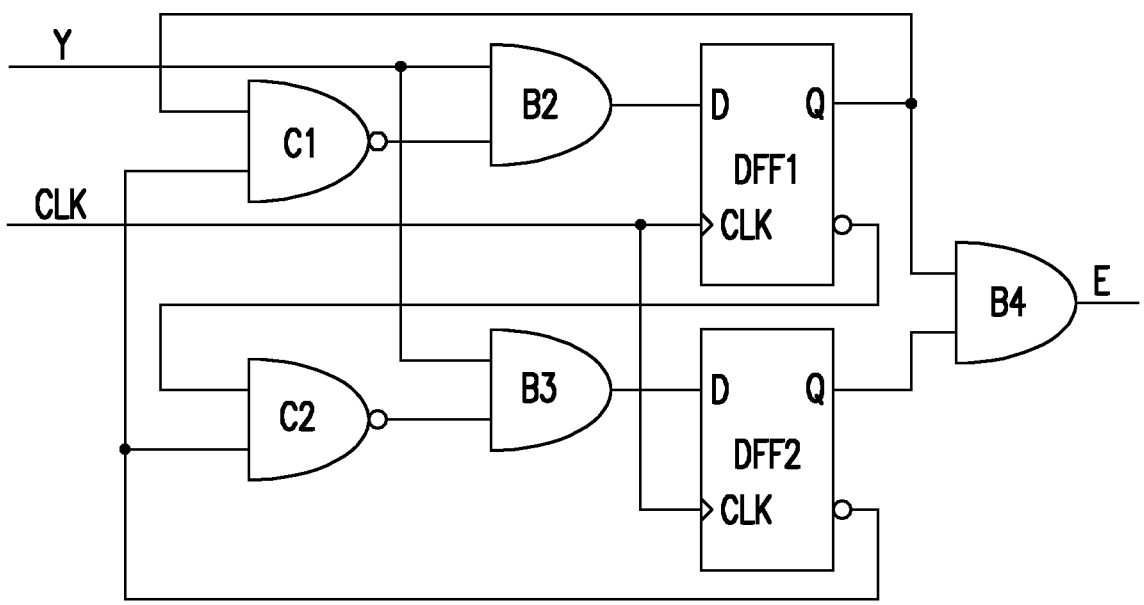
FIG. 6 is a circuit diagram of the 3-digit voter of the disclosure.

As shown in FIG. 6, in this embodiment, the 3-digit voter includes a second two-input AND gate B2, a third two-input AND gate B3, a fourth two-input AND gate B4, a first two-input NOT-AND gate C1, a second two-input NOT-AND gate C2, a first D trigger DFF1 and a second D trigger DFF2. The second two-input AND gate B2, the third two-input AND gate B3, the fourth two-input AND gate B4, the first two-input NOT-AND gate C1 and the second two-input NOT-AND gate C2 respectively have a first input terminal, a second input terminal and an output terminal. The first D trigger DFF1 and the second D trigger DFF2 respectively have an input terminal, an output terminal, a phase inversion output terminal and a clock terminal. The first input terminal of the second two-input AND gate B2 is connected with the first input terminal of the third two-input AND gate B3, and the connecting terminal is the input terminal of the 3-digit voter. The second input terminal of the second two-input AND gate B2 is connected with the output terminal of the first two-input NOT-AND gate C1. The output terminal of the second two-input AND gate B2 is connected with the input terminal of the first D trigger DFF1. The second input terminal of the third two-input AND gate B3 is connected with the output terminal of the second two-input NOT-AND gate C2. The output terminal of the third two-input NAD gate B3 is connected with the input terminal of the second D trigger DFF2. The first input terminal of the first two-input NOT-AND gate C1 and the output terminal of the first D trigger DFF1 are connected with the first input terminal of the fourth two-input AND gate B4. The second input terminal of the first two-input NOT-AND gate C1 and the second input terminal of the second two-input NOT-AND gate C2 are connected with the phase inversion output terminal of the second D trigger DFF2. The first input terminal of the second two-input NOT-AND gate C2 is connected with the phase inversion output terminal of the first D trigger DFF1. The output terminal of the second D trigger DFF2 is connected with the second input terminal of the fourth two-input AND gate B4. The output terminal of the fourth two-input AND gate B4 is the output terminal of the 3-digit voter. The clock terminal of the first D trigger DFF1 is connected with the clock terminal of the second D trigger DFF2, and the connecting terminal is the clock terminal of the 3-digit voter.

Figure 7:
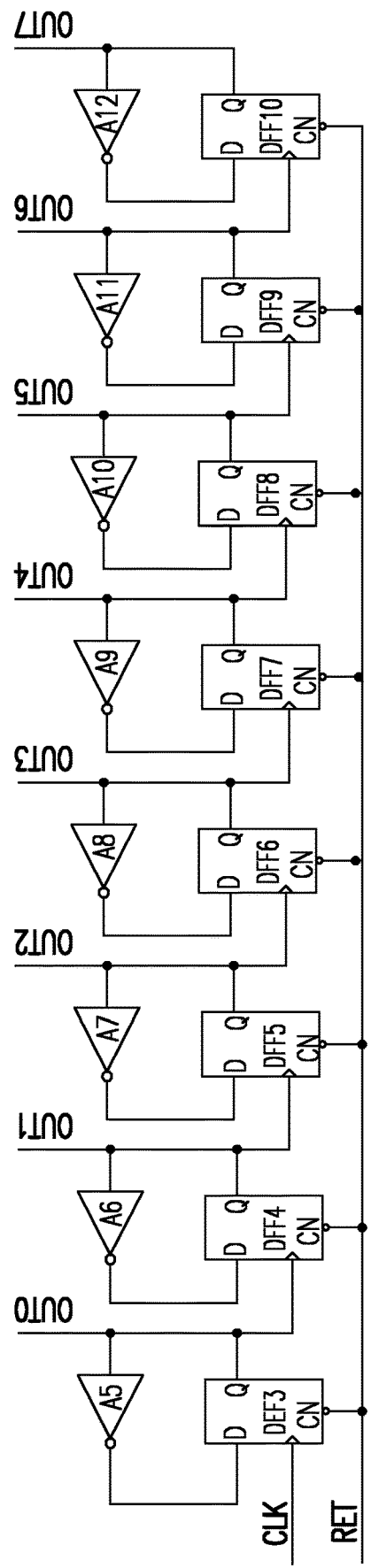
FIG. 7 is a circuit diagram of the 8-digit counter of the disclosure.

As shown in FIG. 7, in this embodiment, the 8-digit counter includes a fifth phase inverter A5, a sixth phase inverter A6, a seventh phase inverter A7, an eighth phase inverter A8, a ninth phase inverter A9, a tenth phase inverter 10, a 11th phase inverter A11, a 12th phase inverter A12, a third D trigger DFF3, a fourth D trigger DFF4, a fifth D trigger DFF5, a sixth D trigger DFF6, a seventh trigger DFF7, an eighth trigger DFF8, a ninth trigger DFF9 and a tenth trigger DFF10. The third D trigger DFF3, the fourth D trigger DFF4, the fifth D trigger DFF5, the sixth D trigger DFF6, the seventh D trigger DFF7, the eighth D trigger DFF8, the ninth D trigger DFF9 and the tenth D trigger DFF10 respectively have a clock terminal, an input terminal, an output terminal and a setting terminal. The clock terminal of the third D trigger DFF3 is the clock terminal of the 8-digit counter. The third D trigger DFF3, the fourth D trigger DFF4, the fifth D trigger DFF5, the sixth D trigger DFF6, the seventh D trigger DFF7, the eighth D trigger DFF8 and the ninth D trigger DFF9 are connected with the setting terminal of the 10th D trigger DFF10, and the connecting terminal is the setting terminal of the 8-digit counter. The clock terminal of the third D trigger DFF3 is the input terminal of the 8-digit counter; the input terminal of the third D trigger DFF3 is connected with the output terminal of the fifth phase inverter A5; the output terminal of the third D trigger DFF3 and the input terminal of the fifth phase inverter A5 are connected with the clock terminal of the fourth D trigger DFF4, and the connecting terminal is the first digit of the 8-digit parallel output terminal of the 8-digit counter. The input terminal of the fourth D trigger DFF4 is connected with the output terminal of the sixth phase inverter A6; the output terminal of the fourth D trigger DFF4 and the input terminal of the sixth phase inverter A6 are connected with the clock terminal of the fifth D trigger DFF5, and the connecting terminal is the second digit of the 8-digit parallel output terminal of the 8-digit counter. The input terminal the fifth D trigger DFF5 is connected with the output terminal of the seventh phase inverter A7; the output terminal of the fifth D trigger DFF5 and the input terminal of the seventh phase inverter A7 are connected with the clock terminal of the sixth D trigger DFF6, and the connecting terminal of the third digit of the 8-digit parallel output terminal of the 8-digit counter. The input terminal of the sixth D trigger DFF6 is connected with the output terminal of the eighth phase inverter A8; the output terminal of the sixth D trigger DFF6 and the input terminal of the eighth phase inverter A8 are connected with the clock terminal of the seventh D trigger DFF7, and the connecting terminal is the fourth digit of the 8-digit parallel output terminal of the 8-digit counter. The input terminal of the seventh D trigger DFF7 is connected with the output terminal of the ninth phase inverter A9; the output terminal of the seventh D trigger DFF7 and the input terminal of the ninth phase inverter A9 are connected with the clock terminal of the eighth D trigger DFF8, and the connecting terminal is the fifth digit of the 8-digit parallel output terminal of the 8-digit counter. The input terminal of the eighth D trigger DFF8 is connected with the output terminal of the tenth phase inverter A10; the output terminal of the eighth D trigger DFF8 and the input terminal of the tenth phase inverter A10 are connected with the clock terminal of the ninth D trigger DFF9, and the connecting terminal is the sixth digit of the 8-digit parallel output terminal of the 8-digit counter. The input terminal of the ninth D trigger DFF9 is connected with the output terminal of the 11th phase inverter A11; the output terminal of the ninth D trigger DFF9 and the input terminal of the 11th phase inverter A11 are connected with the clock terminal of the tenth D trigger DFF10, and the connecting terminal is the seventh digit of the 8-digit parallel output terminal of the 8-digit counter. The input terminal of the tenth D trigger DFF10 is connected with the output terminal of the 12th phase inverter A12; the input terminal of the 12th phase inverter A12 is connected with the output terminal of the tenth D trigger DFF10, and the connecting terminal is the eighth digit of the 8-digit parallel output terminal of the 8-digit counter.

Figure 8A:
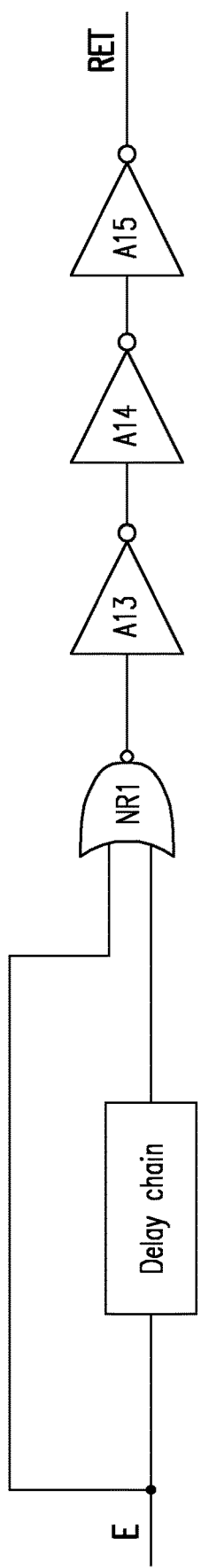
FIG. 8A is a circuit diagram of the beat-frequency oscillator of the disclosure.
Figure 8B:
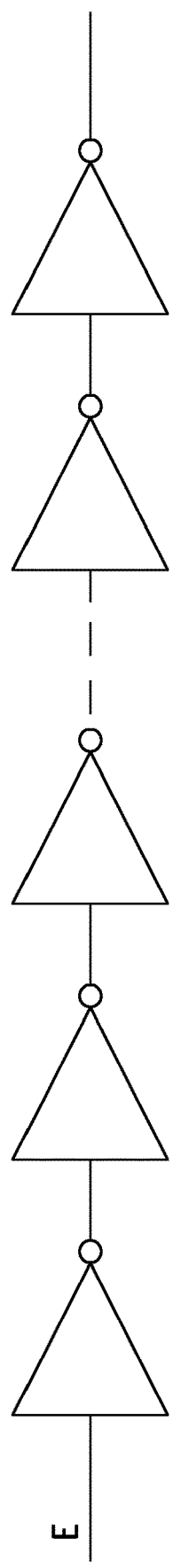
FIG. 8B is a circuit diagram of the delay chain of the disclosure.

As shown in FIGS. 8A and 8B, in this embodiment, the beat-frequency oscillator includes a delay chain, a 13th phase inverter A13, a 14th phase inverter A14, a 15th phase inverter A15 and a first two-input NOT gate NR1. The first two-input NOT gate NR1 has a first input terminal, a second input terminal and an output terminal. An input terminal of the delay chain is connected with the first input terminal of the first two-input NOT gate NR1, and the connecting terminal is the input terminal of the beat-frequency oscillator. An output terminal of the delay chain is connected with the second input terminal of the first two-input NOT gate NR1. The output terminal of the first two-input NOT gate NR1 is connected with the input terminal of the 13th phase inverter A13. The output terminal of the 13th phase inverter A13 is connected with the input terminal of the 14th phase inverter A14. The input terminal of the 14th phase inverter A14 is connected with the input terminal of the 15th phase inverter A15. The output terminal of the 15th phase inverter A15 is the output terminal of the beat-frequency oscillator. The delay chain is formed by 36 phase inverters in series connection, wherein an input terminal of the first phase inverter is the input terminal of the delay chain, and an output terminal of the 36th phase inverter is the output terminal of the delay chain.

Figure 9:
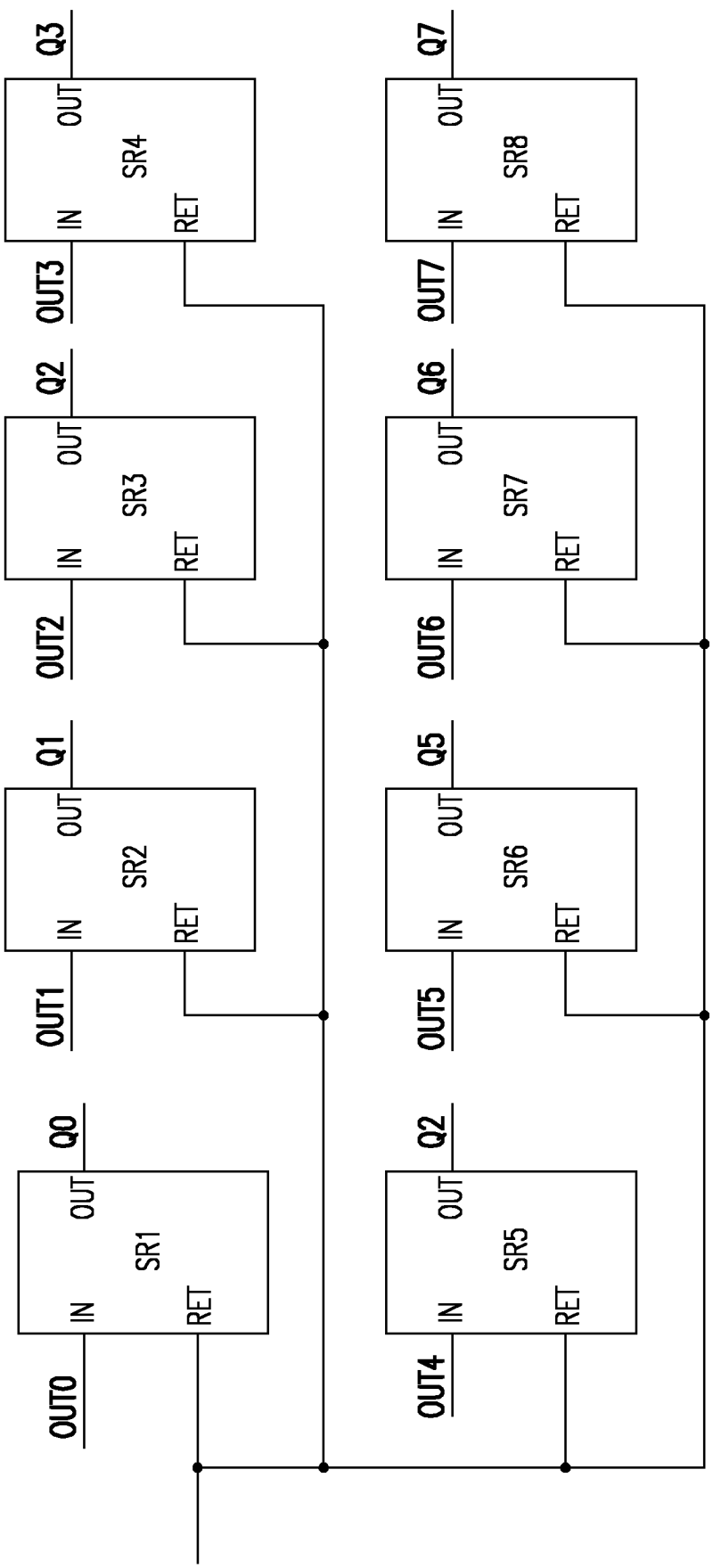
FIG. 9 is a circuit block diagram of the latch of the disclosure.
Figure 10:
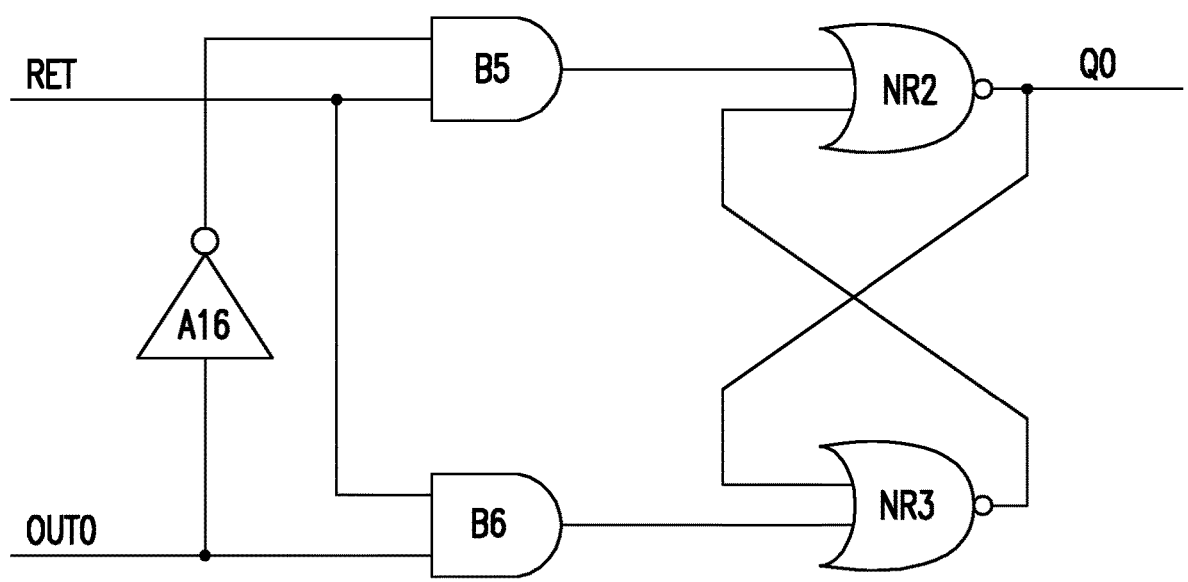
FIG. 10 is a circuit diagram of the latch unit of the disclosure.

As shown in FIG. 9 and FIG. 10, in this embodiment, the latch includes 8 latch units identical with structure. Each one of the latch units has an input terminal, an output terminal and a setting terminal. The resetting units of the 8 latch units are connected, and the connecting terminal is the setting terminal of the latch. The input terminal of the first latch unit SR1 is the first digit of the 8-digit parallel input terminal of the latch; the output terminal of the first latch unit SR1 is the first digit of the 8-digit parallel output terminal of the latch; the input terminal of the second latch unit SR2 is the second digit of the 8-digit parallel input terminal of the latch; the output terminal of the second latch unit SR2 is the second digit of the 8-digit parallel output terminal of the latch; the input terminal of the third latch unit SR3 is the third digit of the 8-digit parallel input terminal of the latch; the output terminal of the third latch unit SR3 is the third digit of the 8-digit parallel output terminal of the latch; the input terminal of the fourth latch unit SR4 is the fourth digit of the 8-digit parallel input terminal of the latch; the output terminal of the fourth latch unit SR4 is the fourth digit of the 8-digit parallel output terminal of the latch; the input terminal of the fifth latch unit SR5 is the fifth digit of the 8-digit parallel input terminal of the latch; the output terminal of the fifth latch unit SR5 is the fifth digit of the 8-digit parallel output terminal of the latch; the input terminal of the sixth latch unit SR6 is the sixth digit of the 8-digit parallel input terminal of the latch; the output terminal of the sixth latch unit SR6 is the sixth digit of the 8-digit parallel output terminal of the latch; the input terminal of the seventh latch unit SR7 is the seventh digit of the 8-digit parallel input terminal of the latch; the output terminal of the seventh latch unit SR7 is the seventh digit of the 8-digit parallel output terminal of the latch; the input terminal of the eighth latch unit SR8 is the eighth digit of the 8-digit parallel input terminal of the latch; and the output terminal of the eighth latch unit SR8 is the eighth digit of the 8-digit parallel output terminal of the latch. Each one of the latch units includes a fifth two-input AND gate B5, a sixth two-input AND gate B6, the 16th phase inverter A16, a second two-input NOT gate NR2 and a third two-input NOT gate NR3; wherein in each one of the latch units, the fifth two-input AND gate B5, the sixth two-input AND gate B6, the second two-input NOT gate NR2 and the third two-input NOT gate NR3 respectively have a first input terminal, a second input terminal and an output terminal, the first input terminal of the fifth two-input AND gate B5 is connected with the output terminal of the 16th phase inverter A16, the second input terminal of the fifth two-input AND gate B5 is connected with the first input terminal of the sixth two-input AND gate B6 and the connecting terminal is the setting terminal of the latch unit, the second input terminal of the second two-input NOT gate NR2 is connected with the output terminal of the third two-input NOT gate NR3, the output terminal of the second two-input NOT gate NR2 is connected with the first input terminal of the third two-input NOT gate NR3 and the connecting terminal is the output terminal of the latch unit, and the second input terminal of the third two-input NOT gate NR3 is connected with the output terminal of the sixth two-input AND gate B6.

Figure 11:
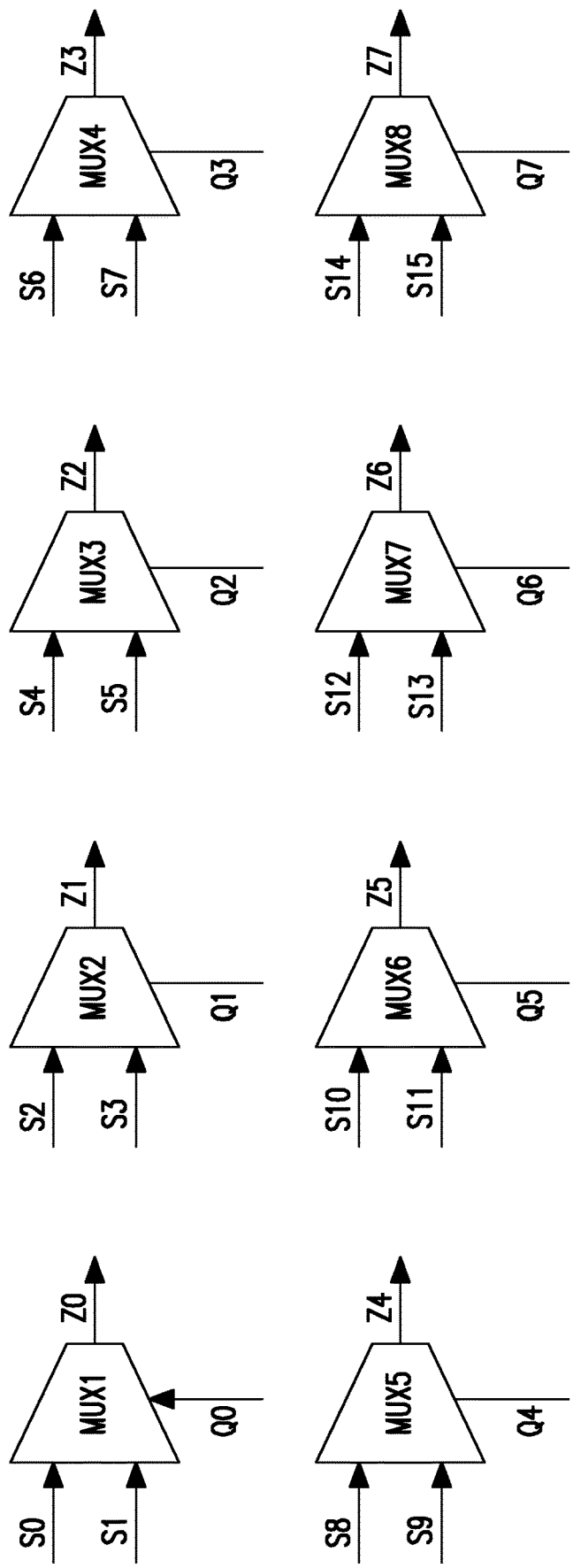
FIG. 11 is a circuit diagram of the lookup table of the disclosure.

As shown in FIG. 11, in this embodiment, the lookup table array includes 8 two-input selectors, and each one of the two-input selectors has a first input terminal, a second input terminal, a control terminal and an output terminal. The control terminal of the first two-input selector MUX1 is the first digit of the 8-digit parallel control terminal of the lookup table array; the output terminal of the first two-input selector MUX1 is the first digit of the 8-digit parallel output terminal of the lookup table array; the first input terminal of the first two-input selector MUX1 is the first digit of the 16-digit parallel input terminal of the lookup table array; and the second input terminal of the first two-input selector MUX1 is the second digit of the 16-digit parallel input terminal of the lookup table array. The control terminal of the second two-input selector MUX2 is the second digit of the 8-digit parallel control terminal of the lookup table array; the output terminal of the second two-input selector MUX2 is the second digit of the 8-digit parallel output terminal of the lookup table array; the first input terminal of the second two-input selector MUX2 is the third digit of the 16-digit parallel input terminal of the lookup table array; and the second input terminal of the second two-input selector MUX2 is the fourth digit of the 16-digit parallel input terminal of the lookup table array. The control terminal of the third two-input selector MUX3 is the third digit of the 8-digit parallel control terminal of the lookup table array; the output terminal of the third two-input selector MUX3 is the third digit of the 8-digit parallel output terminal of the lookup table array; the first input terminal of the third two-input selector MUX3 is the fifth digit of the 16-digit parallel input terminal of the lookup table array; and the second input terminal of the third two-input selector MUX3 is the sixth digit of the 16-digit parallel input terminal of the lookup table array. The control terminal of the fourth two-input selector MUX4 is the fourth digit of the 8-digit parallel control terminal of the lookup table array; the output terminal of the fourth two-input selector MUX4 is the fourth digit of the 8-digit parallel output terminal of the lookup table array; the first input terminal of the fourth two-input selector MUX4 is the seventh digit of the 16-digit parallel input terminal of the lookup table array; and the second input terminal of the fourth two-input selector MUX4 is the eighth digit of the 16-digit parallel input terminal of the lookup table array. The control terminal of the fifth two-input selector MUX5 is the fifth digit of the 8-digit parallel control terminal of the lookup table array; the output terminal of the fifth two-input selector MUX5 is the fifth digit of the 8-digit parallel output terminal of the lookup table array; the first input terminal of the fifth two-input selector MUX5 is the ninth digit of the 16-digit parallel input terminal of the lookup table array; and the second input terminal of the fifth two-input selector MUX5 is the tenth digit of the 16-digit parallel input terminal of the lookup table array. The control terminal of the sixth two-input selector MUX6 is the sixth digit of the 8-digit parallel control terminal of the lookup table array; the output terminal of the sixth two-input selector MUX6 is the sixth digit of the 8-digit parallel output terminal of the lookup table array; the first input terminal of the sixth two-input selector MUX6 is the 11th digit of the 16-digit parallel input terminal of the lookup table array; and the second input terminal of the sixth two-input selector MUX6 is the 12th digit of the 16-digit parallel input terminal of the lookup table array. The control terminal of the seventh two-input selector MUX7 is the seventh digit of the 8-digit parallel control terminal of the lookup table array; the output terminal of the seventh two-input selector MUX7 is the seventh digit of the 8-digit parallel output terminal of the lookup table array; the first input terminal of the seventh two-input selector MUX7 is the 13th digit of the 16-digit parallel input terminal of the lookup table array; and the second input terminal of the seventh two-input selector MUX7 is the 14th digit of the 16-digit parallel input terminal of the lookup table array. The control terminal of the eighth two-input selector MUX8 is the eighth digit of the 8-digit parallel control terminal of the lookup table array; the output terminal of the eighth two-input selector MUX8 is the eighth digit of the 8-digit parallel output terminal of the lookup table array; the first input terminal of the eighth two-input selector MUX8 is the 15th digit of the 16-digit parallel input terminal of the lookup table array; and the second input terminal of the eighth two-input selector MUX9 is the 16th digit of the 16-digit parallel input terminal of the lookup table array.

Figure 12:
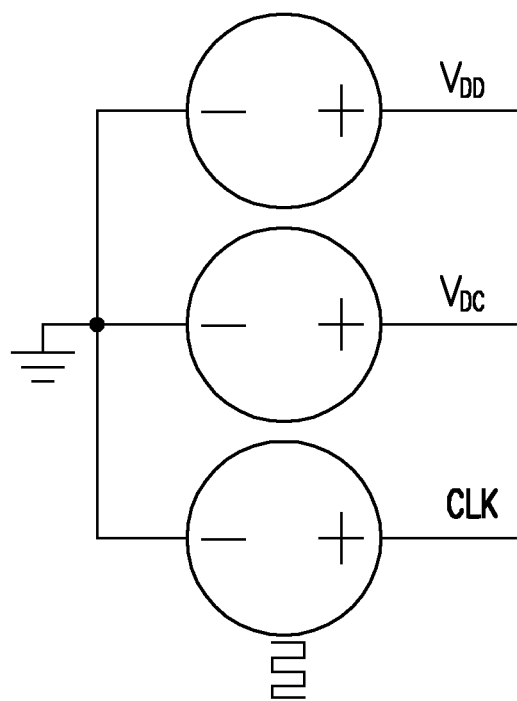
FIG. 12 is a circuit diagram of the control circuit of the disclosure.

As shown in FIG. 12, in this embodiment, the control circuit includes a first direct-current power supply for generating the first control voltage, a second direct-current power supply for generating the second control voltage and a pulse power supply for generating a clock signal.

Figure 13:
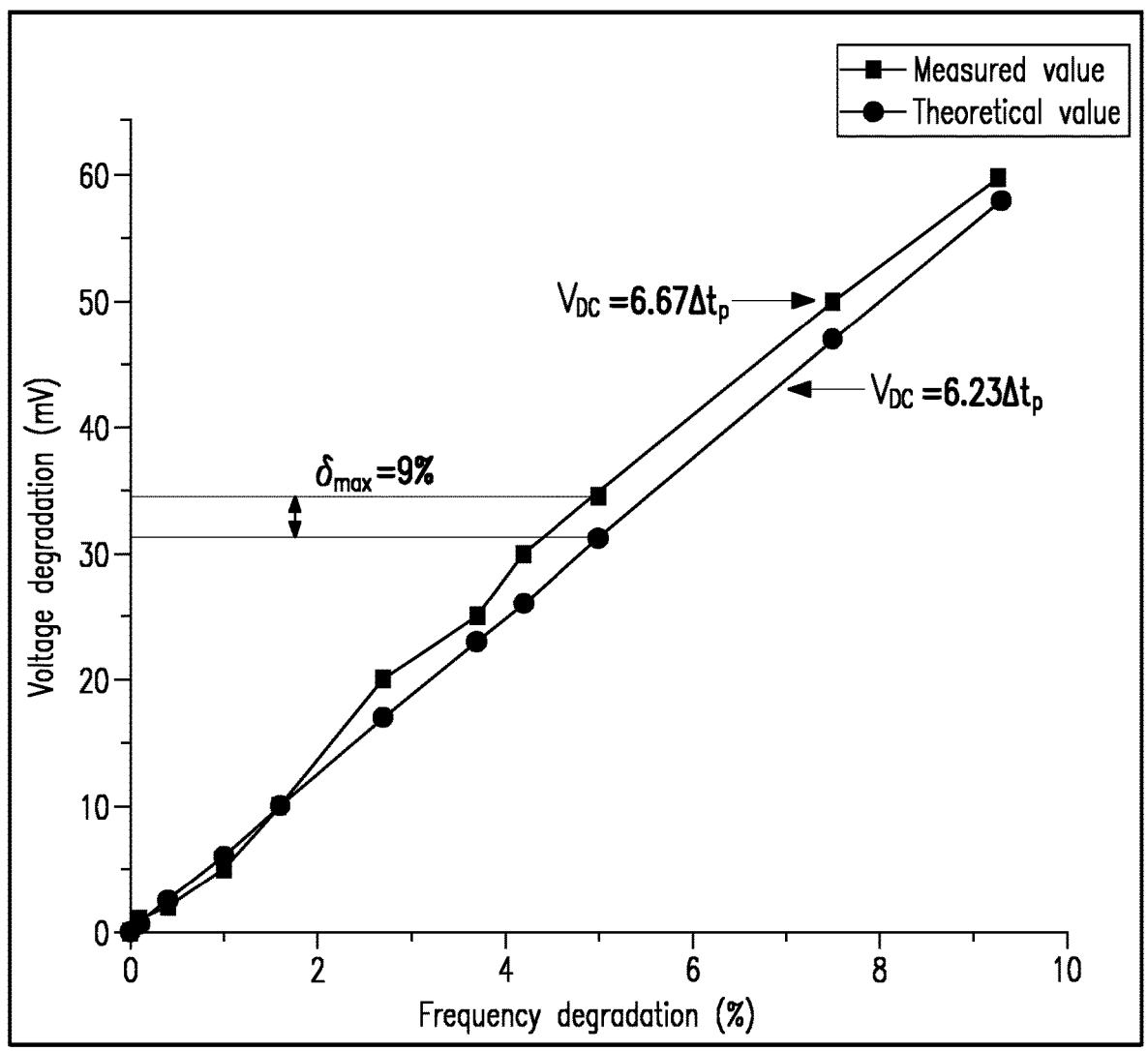
FIG. 13 is a simulation diagram of the first or second voltage controlled oscillator.
Figure 14:
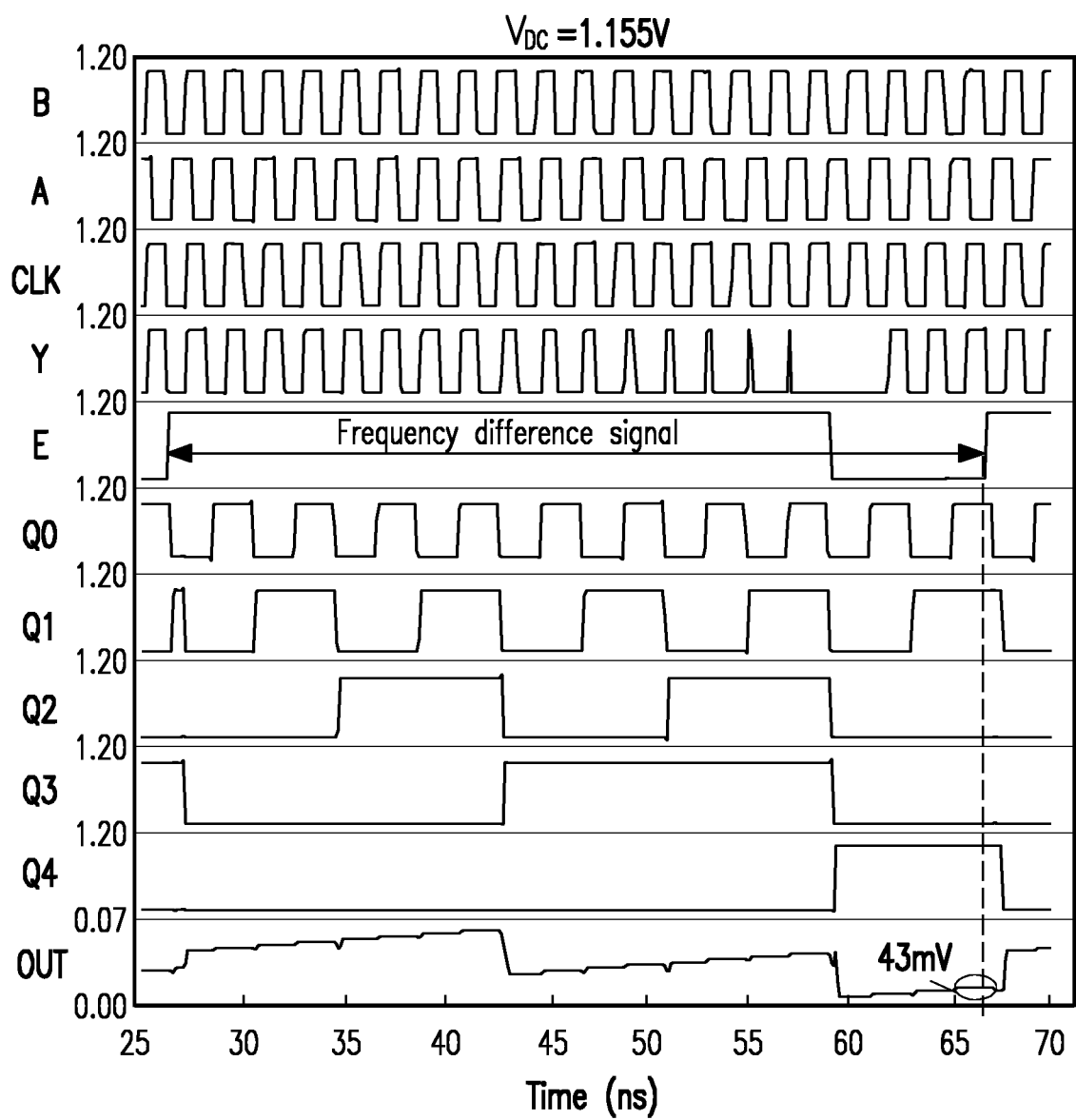
FIG. 14 is a simulation waveform diagram of aging test results of the disclosure.

With the TSMC 65 nm process, the aging sensor undergoes simulation tests with Cadance Spectre simulation tools to verify the aging detection function thereof. The phase comparator, the first voltage controlled oscillator, the second voltage controlled oscillator, the first shaping circuit and the second shaping circuit are fully customized, with a layout area of 38.03 μm×20.34 μm. The simulation diagram of the first or second voltage controlled oscillator can be seen in FIG. 13. Analysis on FIG. 13 shows that, within the range of 10% frequency degradation range, the maximum relative error δ between the theoretical result of the first voltage controlled oscillator and the simulation calculation result is 9%. The voltage controlled oscillator has obvious effectiveness. When the first control voltage VDD is 1.2V and the second control voltage VDC 1.155V, the simulation waveform of the aging test results of the disclosure can be seen in FIG. 14. Analysis on FIG. 14 shows that the corresponding measured value of the frequency difference signal is 19, and the output voltage is 43 mV after table looking up. Therefore, in order to relieve the circuit aging delay caused by the NBTI effect, the control voltage $V_{DC}$ needs to be adjusted to 43 mV. After correction, $V_{DC}$ is 1.198V. It can be known that the aging frequency $f_{str}$ is 512 M after correction, with an error of 0.39% with respect to the reference frequency. Thus it can be seen that the circuit aging detection sensor of the disclosure has correct logics, and can conduct the functions of outputting aging corrected voltage value and postponing circuit aging.

Sensitivity is an import index for measuring sensor performance, including response time and recovery time. Response time refers to the time from the moment when the circuit receives an input to the moment when the circuit outputs a response; and the recovery time refers to the time required by the circuit for recovery. The aging time of the aging sensor is less than or equal to 0.932 ns, and the recovery time less than or equal to 1.000 ns. Therefore, the aging sensor has a relatively high response time. Parameters of the disclosure can be seen in the table 1 below.

TABLE 1

| Sensor parameters | |
| --- | --- |
| Parameter | Range |
| Reference voltage | 1.2 V |
| Response time | ≤0.932 ns |
| Recovery time | ≤1.000 ns |
| Sensing resolution | ≤0.0018% |
| Power consumption | 0.543 mW |

The disclosure was compared with different technologies disclosed in different documents, as shown in table 2. Under the condition of 1% aging frequency degradation, the magnification of the frequency difference was given through the phase comparison circuit. In comparison with technologies in Document 2 and Document 3 (Wang X, Keane J, Kim T H, et al. *Silicon Odometers: Compact In Situ Aging Sensors for Robust System Design*, IEEE Micro, 2014, 34(6): 74-85), the magnification of the disclosure was enhanced by 40%, and the frequency degradation sensing resolution was respectively raised by 82% and 91%. Therefore, the sensor of the disclosure has higher frequency degradation sensing resolution.

TABLE 2

Comparison between the disclosure and relevant documents

| Document | Process (nm) | Frequency (MHz) | Sensing resolution | Factor |
|---|---|---|---|---|
| 2 | 130 nm | 250 | 0.02% | 50× |
| 3 | 130 nm | 1000 | 0.01% | 50× |
| The disclosure | 65 nm | 514 | 0.0018% | 70× |

What is claimed is:

1. A circuit aging detection sensor based on a lookup table (LUT), comprising:
    a control circuit for generating a clock signal and two paths of control voltage,
    a first voltage controlled oscillator,
    a second voltage controlled oscillator,
    a first shaping circuit,
    a second shaping circuit,
    a phase comparator,
    a 3-digit voter,
    a beat-frequency oscillator,
    an 8-digit counter,
    a latch,
    a lookup table array, and
    a digital-analogue converter,
    wherein
    the control circuit has a clock signal output terminal, a first voltage output terminal and a second voltage output terminal;
    the phase comparator has a clock terminal, a first input terminal, a second input terminal and an output terminal;
    the 3-digit voter has a clock terminal, an input terminal and an output terminal;
    the 8-digit counter has an input terminal, a setting terminal and an 8-digit parallel output terminal;
    the latch has a setting terminal, an 8-digit parallel input terminal and an 8-digit parallel output terminal;
    the lookup table array has an 8-digit parallel control terminal, a 16-digit parallel input terminal and an 8-digital parallel output terminal;
    the digital-analogue converter has an 8-digital parallel input terminal and an output terminal;
    the clock signal output terminal of the control circuit is respectively connected with the clock terminal of the phase comparator, the clock terminal of the 3-digit voter and the input terminal of the 8-digit counter;
    the first voltage output terminal of the control circuit is connected with the input terminal of the first voltage controlled oscillator;
    the second voltage output terminal of the control circuit is connected with the input terminal of the second voltage controlled oscillator;
    the output terminal of the first voltage controlled oscillator is connected with the input terminal of the first shaping circuit;
    the output terminal of the second voltage controlled oscillator is connected with the input terminal of the second shaping circuit;
    the output terminal of the first shaping circuit is connected with the first input terminal of the phase comparator;
    the output terminal of the second shaping circuit is connected with the second input terminal of the phase comparator;
    the output terminal of the phase comparator is connected with the input terminal of the 3-digit voter;
    the output terminal of the 3-digit voter is connected with the input terminal of the beat-frequency oscillator;
    the output terminal of the beat-frequency oscillator is respectively connected with the setting terminal of the 8-digit counter and the setting terminal of the latch;
    the 8-digit parallel output terminal of the 8-digit counter is connected with the 8-digit parallel input terminal of the latch;
    the 8-digit parallel output terminal of the latch is connected with the 8-digit parallel control terminal of the lookup table array;
    the 8-digit parallel output terminal of the lookup table array is connected with the 8-digit parallel input terminal of the digital-analogue converter.

2. The circuit aging detection sensor based on the LUT according to claim 1, wherein the first voltage controlled oscillator includes 33 voltage controlled oscillator (VCO) units;
    each one of the VCO units has a first input terminal, a second input terminal, a first output terminal, a second output terminal, a power terminal and a grounding terminal;
    the power terminals of all 33 VCO units are connected to a power supply, and the grounding terminals of all 33 VCO units are grounded;
    the first input terminal of the first VCO unit is connected with the first output terminal of the 33rd VCO unit, and the connecting terminal is the output terminal of the first voltage controlled oscillator;
    the second input terminal of the first VCO unit is connected with the second output terminal of the 33rd VCO unit; the first output terminal of the kth VCO unit is connected with the first input terminal of the (K+1)th VCO unit;
    the second output terminal of the kth VCO unit is connected with the second input terminal of the (K+1)th VCO unit, k+1, 2, . . . , 32;
    each one of the VCO units includes a first PMOS tube, a second PMOS tube, a first NMOS tube and a second NMOS tube, wherein the source electrode of the first PMOS tube is connected with the source electrode of the second PMOS tube, and the connecting terminal is the power terminal of the VCO unit;
    the grid electrode of the first PMOS tube and the drain electrode of the second PMOS tube are connected with the drain electrode of the second NMOS tube, and the connecting terminal is the first output terminal of the VCO unit;
    the drain electrode of the first PMOS tube and the grid electrode of the second PMOS tube are connected with the drain electrode of the first NMOS tube, and the connecting terminal is the second output terminal of the VCO unit;
    the grid electrode of the first NMOS tube is the first input terminal of the VCO unit;
    the grid electrode of the second NMOS tube is the second input terminal of the VCO unit;
    the source electrode of the first NMOS tube is connected with the source electrode of the second NMOS tube, and the connecting terminal is the grounding terminal of the VCO unit;
    the circuit structure of the second voltage controlled oscillator is identical with the circuit structure of the first voltage controlled oscillator.

3. The circuit aging detection sensor based on the LUT according to claim 1, wherein the first shaping circuit includes a third PMOS tube, a fourth PMOS tube, a third NMOS tube, a fourth NMOS tube and a first phase inverter;

the source electrode of the third PMOS tube and the source electrode of the fourth PMOS tube are both connected to the power supply;
the grid electrode of the third PMOS tube and the drain electrode of the fourth PMOS tube are connected with the drain electrode of the fourth NMOS tube, and the connecting terminal is the output terminal of the first shaping circuit;
the drain electrode of the third PMOS tube and the grid electrode of the fourth PMOS tube are connected with the drain electrode of the third NMOS tube;
the grid electrode of the third NMOS tube is connected with the input terminal of the first phase inverter, and the connecting terminal is the input terminal of the first shaping circuit;
the output terminal of the first phase inverter is connected with the grid electrode of the fourth NMOS tube;
the source electrode of the third NMOS tube and the source electrode of the fourth NMOS tube are both grounded;
the circuit structure of the second shaping circuit is identical with the circuit structure of the first shaping circuit.

4. The circuit aging detection sensor based on the LUT according to claim 1, wherein the phase comparator includes a fifth PMOS tube, a sixth PMOS tube, a fifth NMOS tube, a sixth NMOS tube, a seventh NMOS tube, a second phase inverter, a third phase inverter, a fourth phase inverter and a first two-input AND gate;

the first two-input AND gate has a first input terminal, a second input terminal and an output terminal;
the source electrode of the fifth PMOS tube and the source electrode of the sixth PMOS tube are both connected to the power supply;
the grid electrode of the fifth PMOS tube is connected with the grid electrode of the seventh NMOS tube, and the connecting terminal is the clock terminal of the phase comparator;
the drain electrode of the fifth PMOS tube, the drain electrode of the sixth NMOS tube and the grid electrode of the sixth PMOS tube are connected with the input terminal of the second phase inverter;
the drain electrode of the sixth PMOS tube, the output terminal of the second phase inverter and the drain electrode of the fifth NMOS tube are connected with the input terminal of the third phase inverter;
the grid electrode of the sixth NMOS tube is connected with the output terminal of the first two-input AND gate;
the source electrode of the sixth NMOS tube is connected with the drain electrode of the seventh NMOS tube;
the source electrode of the seventh NMOS tube and the source electrode of the fifth NMOS tube are both grounded;
the grid electrode of the fifth NMOS tube and the output terminal of the third phase inverter are connected with the input terminal of the fourth phase inverter;
the output terminal of the fourth phase inverter is the output terminal of the phase comparator;
the first input terminal of the first two-input AND gate is the first input terminal of the phase comparator;
the second input terminal of the first two-input AND gate is the second input terminal of the phase comparator.

5. The circuit aging detection sensor based on the LUT according to claim 1, wherein the 3-digit voter includes a second two-input AND gate, a third two-input AND gate, a fourth two-input AND gate, a first two-input NOT-AND gate, a second two-input NOT-AND gate, a first D trigger and a second D trigger;

the second two-input AND gate, the third two-input AND gate, the fourth two-input AND gate, the first two-input NOT-AND gate and the second two-input NOT-AND gate respectively have a first input terminal, a second input terminal and an output terminal;
the first D trigger and the second D trigger respectively have an input terminal, an output terminal, a phase inversion output terminal and a clock terminal;
the first input terminal of the second two-input AND gate is connected with the first input terminal of the third two-input AND gate, and the connecting terminal is the input terminal of the 3-digit voter;
the second input terminal of the second two-input AND gate is connected with the output terminal of the first two-input NOT-AND gate;
the output terminal of the second two-input AND gate is connected with the input terminal of the first D trigger;
the second input terminal of the third two-input AND gate is connected with the output terminal of the second two-input NOT-AND gate;
the output terminal of the third two-input NAD gate is connected with the input terminal of the second D trigger;
the first input terminal of the first two-input NOT-AND gate and the output terminal of the first D trigger are connected with the first input terminal of the fourth two-input AND gate;
the second input terminal of the first two-input NOT-AND gate and the second input terminal of the second two-input NOT-AND gate are connected with the phase inversion output terminal of the second D trigger;
the first input terminal of the second two-input NOT-AND gate is connected with the phase inversion output terminal of the first D trigger;
the output terminal of the second D trigger is connected with the second input terminal of the fourth two-input AND gate;
the output terminal of the fourth two-input AND gate is the output terminal of the 3-digit voter;
the clock terminal of the first D trigger is connected with the clock terminal of the second D trigger, and the connecting terminal is the clock terminal of the 3-digit voter.

6. The circuit aging detection sensor based on the LUT according to claim 1, wherein the 8-digit counter includes a fifth phase inverter, a sixth phase inverter, a seventh phase inverter, an eighth phase inverter, a ninth phase inverter, a tenth phase inverter, a 11th phase inverter, a 12th phase inverter, a third D trigger, a fourth D trigger, a fifth D trigger, a sixth D trigger, a seventh trigger, an eighth trigger, a ninth trigger and a tenth trigger;

the third D trigger, the fourth D trigger, the fifth D trigger, the sixth D trigger, the seventh D trigger, the eighth D trigger, the ninth D trigger and the tenth D trigger respectively have a clock terminal, an input terminal, an output terminal and a setting terminal;
the clock terminal of the third D trigger is the clock terminal of the 8-digit counter;
the setting terminals of the third D trigger, the fourth D trigger, the fifth D trigger, the sixth D trigger, the seventh D trigger, the eighth D trigger, the ninth D trigger and the 10th D trigger are connected, and the connecting terminal is the setting terminal of the 8-digit counter;

the clock terminal of the third D trigger is the input terminal of the 8-digit counter; the input terminal of the third D trigger is connected with the output terminal of the fifth phase inverter; the output terminal of the third D trigger and the input terminal of the fifth phase inverter are connected with the clock terminal of the fourth D trigger, and the connecting terminal is the first digit of the 8-digit parallel output terminal of the 8-digit counter;

the input terminal of the fourth D trigger is connected with the output terminal of the sixth phase inverter; the output terminal of the fourth D trigger and the input terminal of the sixth phase inverter are connected with the clock terminal of the fifth D trigger, and the connecting terminal is the second digit of the 8-digit parallel output terminal of the 8-digit counter;

the input terminal the fifth D trigger is connected with the output terminal of the seventh phase inverter; the output terminal of the fifth D trigger and the input terminal of the seventh phase inverter are connected with the clock terminal of the sixth D trigger, and the connecting terminal of the third digit of the 8-digit parallel output terminal of the 8-digit counter;

the input terminal of the sixth D trigger is connected with the output terminal of the eighth phase inverter; the output terminal of the sixth D trigger and the input terminal of the eighth phase inverter are connected with the clock terminal of the seventh D trigger, and the connecting terminal is the fourth digit of the 8-digit parallel output terminal of the 8-digit counter;

the input terminal of the seventh D trigger is connected with the output terminal of the ninth phase inverter; the output terminal of the seventh D trigger and the input terminal of the ninth phase inverter are connected with the clock terminal of the eighth D trigger, and the connecting terminal is the fifth digit of the 8-digit parallel output terminal of the 8-digit counter;

the input terminal of the eighth D trigger is connected with the output terminal of the tenth phase inverter; the output terminal of the eighth D trigger and the input terminal of the tenth phase inverter are connected with the clock terminal of the ninth D trigger, and the connecting terminal is the sixth digit of the 8-digit parallel output terminal of the 8-digit counter;

the input terminal of the ninth D trigger is connected with the output terminal of the 11th phase inverter; the output terminal of the ninth D trigger and the input terminal of the 11th phase inverter are connected with the clock terminal of the tenth D trigger, and the connecting terminal is the seventh digit of the 8-digit parallel output terminal of the 8-digit counter;

the input terminal of the tenth D trigger is connected with the output terminal of the 12th phase inverter; the input terminal of the 12th phase inverter is connected with the output terminal of the tenth D trigger, and the connecting terminal is the eighth digit of the 8-digit parallel output terminal of the 8-digit counter.

7. The circuit aging detection sensor based on the LUT according to claim 1, wherein the beat-frequency oscillator includes a delay chain, a 13th phase inverter, a 14th phase inverter, a 15th phase inverter and a first two-input NOT gate;

the first two-input NOT gate has a first input terminal, a second input terminal and an output terminal;

an input terminal of the delay chain is connected with the first input terminal of the first two-input NOT gate, and the connecting terminal is the input terminal of the beat-frequency oscillator;

an output terminal of the delay chain is connected with the second input terminal of the first two-input NOT gate;

the output terminal of the first two-input NOT gate is connected with the input terminal of the 13th phase inverter;

the output terminal of the 13th phase inverter is connected with the input terminal of the 14th phase inverter;

the input terminal of the 14th phase inverter is connected with the input terminal of the 15th phase inverter;

the output terminal of the 15th phase inverter is the output terminal of the beat-frequency oscillator;

the delay chain is formed by 36 phase inverters in series connection, wherein an input terminal of the first phase inverter is the input terminal of the delay chain, and an output terminal of the 36th phase inverter is the output terminal of the delay chain.

8. The circuit aging detection sensor based on the LUT according to claim 1, wherein the latch includes 8 latch units identical with structure, each one of the latch units has an input terminal, an output terminal and a setting terminal;

the resetting units of the 8 latch units are connected, and the connecting terminal is the setting terminal of the latch;

the input terminal of the first latch unit is the first digit of the 8-digit parallel input terminal of the latch; the output terminal of the first latch unit is the first digit of the 8-digit parallel output terminal of the latch; the input terminal of the second latch unit is the second digit of the 8-digit parallel input terminal of the latch; the output terminal of the second latch unit is the second digit of the 8-digit parallel output terminal of the latch; the input terminal of the third latch unit is the third digit of the 8-digit parallel input terminal of the latch; the output terminal of the third latch unit is the third digit of the 8-digit parallel output terminal of the latch; the input terminal of the fourth latch unit is the fourth digit of the 8-digit parallel input terminal of the latch; the output terminal of the fourth latch unit is the fourth digit of the 8-digit parallel output terminal of the latch; the input terminal of the fifth latch unit is the fifth digit of the 8-digit parallel input terminal of the latch; the output terminal of the fifth latch unit is the fifth digit of the 8-digit parallel output terminal of the latch; the input terminal of the sixth latch unit is the sixth digit of the 8-digit parallel input terminal of the latch; the output terminal of the sixth latch unit is the sixth digit of the 8-digit parallel output terminal of the latch; the input terminal of the seventh latch unit is the seventh digit of the 8-digit parallel input terminal of the latch; the output terminal of the seventh latch unit is the seventh digit of the 8-digit parallel output terminal of the latch; the input terminal of the eighth latch unit is the eighth digit of the 8-digit parallel input terminal of the latch; and the output terminal of the eighth latch unit is the eighth digit of the 8-digit parallel output terminal of the latch;

each one of the latch units includes a fifth two-input AND gate, a sixth two-input AND gate, the 16th phase inverter, a second two-input NOT gate and a third two-input NOT gate; wherein in each one of the latch units, the fifth two-input AND gate, the sixth two-input AND gate, the second two-input NOT gate and the third two-input NOT gate respectively have a first input terminal, a second input terminal and an output terminal, the first input terminal of the fifth two-input AND gate is connected with the output terminal of the 16th phase inverter, the second input terminal of the fifth two-input AND gate is connected with the first input terminal of the sixth two-input AND gate and the connecting terminal is the setting terminal of the latch unit, the second input terminal of the second two-input NOT gate is connected with the output terminal of the third two-input NOT gate, the output terminal of the second two-input NOT gate is connected with the first input terminal of the third two-input NOT gate and the connecting terminal is the output terminal of the latch unit, and the second input terminal of the third two-input NOT gate is connected with the output terminal of the sixth two-input AND gate.

9. The circuit aging detection sensor based on the LUT according to claim 1, wherein the lookup table array includes 8 two-input selectors, and each one of the two-input selectors has a first input terminal, a second input terminal, a control terminal and an output terminal;

the control terminal of the first two-input selector is the first digit of the 8-digit parallel control terminal of the lookup table array; the output terminal of the first two-input selector is the first digit of the 8-digit parallel output terminal of the lookup table array; the first input terminal of the first two-input selector is the first digit of the 16-digit parallel input terminal of the lookup table array; and the second input terminal of the first two-input selector is the second digit of the 16-digit parallel input terminal of the lookup table array;

the control terminal of the second two-input selector is the second digit of the 8-digit parallel control terminal of the lookup table array; the output terminal of the second two-input selector is the second digit of the 8-digit parallel output terminal of the lookup table array; the first input terminal of the second two-input selector is the third digit of the 16-digit parallel input terminal of the lookup table array; and the second input terminal of the second two-input selector is the fourth digit of the 16-digit parallel input terminal of the lookup table array;

the control terminal of the third two-input selector is the third digit of the 8-digit parallel control terminal of the lookup table array; the output terminal of the third two-input selector MUX3 is the third digit of the 8-digit parallel output terminal of the lookup table array; the first input terminal of the third two-input selector is the fifth digit of the 16-digit parallel input terminal of the lookup table array; and the second input terminal of the third two-input selector is the sixth digit of the 16-digit parallel input terminal of the lookup table array;

the control terminal of the fourth two-input selector is the fourth digit of the 8-digit parallel control terminal of the lookup table array; the output terminal of the fourth two-input selector is the fourth digit of the 8-digit parallel output terminal of the lookup table array; the first input terminal of the fourth two-input selector is the seventh digit of the 16-digit parallel input terminal of the lookup table array; and the second input terminal of the fourth two-input selector is the eighth digit of the 16-digit parallel input terminal of the lookup table array;

the control terminal of the fifth two-input selector is the fifth digit of the 8-digit parallel control terminal of the lookup table array; the output terminal of the fifth two-input selector is the fifth digit of the 8-digit parallel output terminal of the lookup table array; the first input terminal of the fifth two-input selector is the ninth digit of the 16-digit parallel input terminal of the lookup table array; and the second input terminal of the fifth two-input selector is the tenth digit of the 16-digit parallel input terminal of the lookup table array;

the control terminal of the sixth two-input selector is the sixth digit of the 8-digit parallel control terminal of the lookup table array; the output terminal of the sixth two-input selector is the sixth digit of the 8-digit parallel output terminal of the lookup table array; the first input terminal of the sixth two-input selector is the 11th digit of the 16-digit parallel input terminal of the lookup table array; and the second input terminal of the sixth two-input selector is the 12th digit of the 16-digit parallel input terminal of the lookup table array;

the control terminal of the seventh two-input selector is the seventh digit of the 8-digit parallel control terminal of the lookup table array; the output terminal of the seventh two-input selector is the seventh digit of the 8-digit parallel output terminal of the lookup table array; the first input terminal of the seventh two-input selector is the 13th digit of the 16-digit parallel input terminal of the lookup table array; and the second input terminal of the seventh two-input selector is the 14th digit of the 16-digit parallel input terminal of the lookup table array;

the control terminal of the eighth two-input selector is the eighth digit of the 8-digit parallel control terminal of the lookup table array; the output terminal of the eighth two-input selector is the eighth digit of the 8-digit parallel output terminal of the lookup table array; the first input terminal of the eighth two-input selector is the 15th digit of the 16-digit parallel input terminal of the lookup table array; and the second input terminal of the eighth two-input selector is the 16th digit of the 16-digit parallel input terminal of the lookup table array.

10. The circuit aging detection sensor based on the LUT according to claim 1, wherein The control circuit includes a first direct-current power supply for generating the first control voltage, a second direct-current power supply for generating the second control voltage and a pulse power supply for generating a clock signal.

* * * * *